United States Patent
Birrittella

(10) Patent No.: US 9,325,449 B2
(45) Date of Patent: Apr. 26, 2016

(54) LANE ERROR DETECTION AND LANE REMOVAL MECHANISM TO REDUCE THE PROBABILITY OF DATA CORRUPTION

(71) Applicant: Intel Corporation, Santa Clara, CA (US)

(72) Inventor: Mark S. Birrittella, Chippewa Falls, WI (US)

(73) Assignee: Intel Corporation, Santa Clara, CA (US)

( * ) Notice: Subject to any disclaimer, the term of this patent is extended or adjusted under 35 U.S.C. 154(b) by 106 days.

(21) Appl. No.: 14/099,345

(22) Filed: Dec. 6, 2013

(65) Prior Publication Data

US 2015/0163014 A1     Jun. 11, 2015

(51) Int. Cl.
  *H03M 13/00* (2006.01)
  *G06F 11/10* (2006.01)
  *H04L 1/00* (2006.01)
  *H03M 13/09* (2006.01)

(52) U.S. Cl.
  CPC ............. *H04L 1/0045* (2013.01); *H03M 13/09* (2013.01); *H04L 1/0061* (2013.01)

(58) Field of Classification Search
  CPC . G06F 11/1076; G06F 3/0619; G06F 3/0647; G06F 3/0689
  USPC .................................................. 714/807, 758
  See application file for complete search history.

(56) References Cited

U.S. PATENT DOCUMENTS

| | | | | |
|---|---|---|---|---|
| 4,442,502 A | * | 4/1984 | Friend et al. | 710/316 |
| 2001/0022786 A1 | * | 9/2001 | King et al. | 370/412 |
| 2005/0149795 A1 | * | 7/2005 | Manoni | 714/726 |
| 2007/0299970 A1 | | 12/2007 | Huang et al. | |
| 2008/0256281 A1 | * | 10/2008 | Fahr et al. | 710/305 |
| 2008/0276032 A1 | * | 11/2008 | Iida et al. | 710/316 |
| 2010/0005345 A1 | | 1/2010 | Ferraiolo et al. | |
| 2010/0005375 A1 | * | 1/2010 | Dell et al. | 714/807 |
| 2011/0022935 A1 | | 1/2011 | McDaniel | |
| 2013/0306276 A1 | | 11/2013 | Duchesneau et al. | |

OTHER PUBLICATIONS

International Search Report and Written Opinion received for PCT Patent Application No. PCT/US2014/068931, mailed on Feb. 26, 2015, 15 pages.

* cited by examiner

*Primary Examiner* — Guy Lamarre

(74) *Attorney, Agent, or Firm* — Law Office of R. Alan Burnett, P.S.

(57) ABSTRACT

Method, apparatus, and systems for detecting lane errors and removing errant lanes in multi-lane links. Data comprising link packets is split into a plurality of bitstreams and transmitted over respective lanes of a multi-lane link in parallel. The bitstream data is received at multiple receive lanes of a receiver port and processed to reassemble link packets and to calculate a CRC over the data received on each lane. The link packets include a transmitted CRC that is compared to a received CRC to detect link packet errors. Upon detection of a link packet error, per-lane or per transfer group CRC values are stored, and a retry request is issued to retransmit the bad packet. In conjunction with receipt of the retransmitted packet, per-lane or per transfer group CRC values are recalculated over the received data and compared with the stored per-lane or per transfer group CRC values to detect the lane causing the link packet error.

30 Claims, 31 Drawing Sheets

VL1 interleaves VL0

Back to the remaining VL0 packet flits

| Flit 0[64:0] |
| --- |
| Flit 1[64:0] |
| Flit 2[64:0] |
| Flit 3[64:0] |
| Flit 4[64:0] |
| Flit 5[64:0] |
| Flit 6[64:0] |
| Flit 7[64:0] |
| Flit 8[64:0] |
| Flit 9[64:0] |
| Flit 10[64:0] |
| Flit 11[64:0] |
| Flit 12[64:0] |
| Flit 13[64:0] |
| Flit 14[64:0] |
| Flit 15[64:0] |
| LCRC[15:0] |

*Fig. 5*

| |
|---|
| Flit 0[64:0] |
| Flit 1[64:0] |
| Flit 2[64:0] |
| Flit 3[64:0] |
| Flit 4[64:0] |
| Flit 5[64:0] |
| Flit 6[64:0] |
| Flit 7[64:0] |
| Flit 8[64:0] |
| Flit 9[64:0] |
| Flit 10[64:0] |
| Flit 11[64:0] |
| Flit 12[64:0] |
| Flit 13[64:0] |
| Flit 14[64:0] |
| Flit 15[64:0] |
| LCRC[13:0] C[1:0] |

*Fig. 6*

| |
|---|
| Flit 0[64:0] |
| Flit 1[64:0] |
| Flit 2[64:0] |
| Flit 3[64:0] |
| Flit 4[64:0] |
| Flit 5[64:0] |
| Flit 6[64:0] |
| Flit 7[64:0] |
| Flit 8[64:0] |
| Flit 9[64:0] |
| Flit 10[64:0] |
| Flit 11[64:0] |
| Flit 12[64:0] |
| Flit 13[64:0] |
| Flit 14[64:0] |
| Flit 15[64:0] |

| LCRC3[11:0] | LCRC2[11:0] | LCRC1[11:0] | LCRC0[11:0] |
|---|---|---|---|

*Fig. 7*

| Distinguishing Control Flit 0[64:0] |
|---|
| Reserved 1[64:0] |
| Reserved 2[64:0] |
| Reserved 3[64:0] |
| Reserved 4[64:0] |
| Reserved 5[64:0] |
| Reserved 6[64:0] |
| Reserved 7[64:0] |
| Reserved 8[64:0] |
| Reserved 9[64:0] |
| Reserved 10[64:0] |
| Reserved 11[64:0] |
| Reserved 12[64:0] |
| Reserved 13[64:0] |
| Reserved 14[64:0] |
| Reserved 15[64:0] |
| LCRC[15:0] |

*Fig. 8*

| Standard Detection LTP | |
|---|---|
| Flit 0[64:0] | Flit 1[64:0] |
| Flit 2[64:0] | Flit 3[64:0] |
| Flit 4[64:0] | Flit 5[64:0] |
| Flit 6[64:0] | Flit 7[64:0] |
| Flit 8[64:0] | Flit 9[64:0] |
| Flit 10[64:0] | Flit 11[64:0] |
| Flit 12[64:0] | Flit 13[64:0] |
| Flit 14[64:0] | Flit 15[64:0] |
| LCRC[15:0] | |

*Fig. 9a*

| Enhanced Detection LTP | |
|---|---|
| Flit 0[64:0] | Flit 1[64:0] |
| Flit 2[64:0] | Flit 3[64:0] |
| Flit 4[64:0] | Flit 5[64:0] |
| Flit 6[64:0] | Flit 7[64:0] |
| Flit 8[64:0] | Flit 9[64:0] |
| Flit 10[64:0] | Flit 11[64:0] |
| Flit 12[64:0] | Flit 13[64:0] |
| Flit 14[64:0] | Flit 15[64:0] |
| LCRC3[11:0] LCRC2[11:0] LCRC1[11:0] LCRC0[11:0] | |

*Fig. 9b*

| CRC[15:0] | LTP[1055:0] |
|---|---|
| | {flit15,flit14,flit13,flit12,flit11,flit10,flit9,flit8,flit7,flit6,flit5,flit4,flit3,flit2,flit1,flit0} |
| | {xfr32,xfr31,xfr30,xfr29,xfr28,xfr27,xfr26,xfr25,xfr24,xfr23,xfr22,xfr21,xfr20,xfr19,xfr18,xfr17,xfr16, xfr15,xfr14,xfr13,xfr12,xfr11,xfr10,xfr9,xfr8,xfr7,xfr6,xfr5,xfr4,xfr3,xfr2,xfr1,xfr0} |

*Fig. 19*

| Lane3[31:0] | Lane2[31:0] | Lane1[31:0] | Lane0[31:0] |
|---|---|---|---|
| xfr3 | xfr2 | xfr1 | xfr0 |
| xfr7 | xfr6 | xfr5 | xfr4 |
| xfr11 | xfr10 | xfr9 | xfr8 |
| xfr15 | xfr14 | xfr13 | xfr12 |
| xfr19 | xfr18 | xfr17 | xfr16 |
| xfr23 | xfr22 | xfr21 | xfr20 |
| xfr27 | xfr26 | xfr25 | xfr24 |
| xfr31 | xfr30 | xfr29 | xfr28 |
| xfr2 | xfr1 | xfr0 | xfr32 |
| xfr6 | xfr5 | xfr4 | xfr3 |
| xfr10 | xfr9 | xfr8 | xfr7 |
| xfr14 | xfr13 | xfr12 | xfr11 |
| xfr18 | xfr17 | xfr16 | xfr15 |
| xfr22 | xfr21 | xfr20 | xfr19 |
| xfr26 | xfr25 | xfr24 | xfr23 |
| xfr30 | xfr29 | xfr28 | xfr27 |
| xfr1 | xfr0 | xfr32 | xfr31 |
| xfr5 | xfr4 | xfr3 | xfr2 |
| xfr9 | xfr8 | xfr7 | xfr6 |
| xfr13 | xfr12 | xfr11 | xfr10 |
| xfr17 | xfr16 | xfr15 | xfr14 |
| xfr21 | xfr20 | xfr19 | xfr18 |
| xfr25 | xfr24 | xfr23 | xfr22 |
| xfr29 | xfr28 | xfr27 | xfr26 |
| xfr0 | xfr32 | xfr31 | xfr30 |
| xfr4 | xfr3 | xfr2 | xfr1 |
| xfr8 | xfr7 | xfr6 | xfr5 |
| xfr12 | xfr11 | xfr10 | xfr9 |
| xfr16 | xfr15 | xfr14 | xfr13 |
| xfr20 | xfr19 | xfr18 | xfr17 |
| xfr24 | xfr23 | xfr22 | xfr21 |
| xfr28 | xfr27 | xfr26 | xfr25 |
| xfr32 | xfr31 | xfr30 | xfr29 |

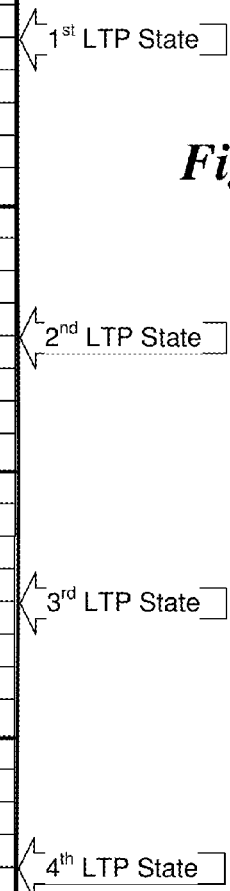

*Fig. 20*

| Lane1[31:0] | Lane0[31:0] |
|---|---|
| xfr1 | xfr0 |
| xfr3 | xfr2 |
| xfr5 | xfr4 |
| xfr7 | xfr6 |
| xfr9 | xfr8 |
| xfr11 | xfr10 | ······ 544 ··· CRC-G0
| xfr13 | xfr12 |
| xfr15 | xfr14 |
| xfr17 | xfr16 | ⟵ 1st LTP State
| xfr19 | xfr18 |
| xfr21 | xfr20 |
| xfr23 | xfr22 |
| xfr25 | xfr24 | ······ 512 ··· CRC-G1
| xfr27 | xfr26 |
| xfr29 | xfr28 |
| xfr31 | xfr30 |
| xfr0 | xfr32 |
| xfr2 | xfr1 |
| xfr4 | xfr3 |
| xfr6 | xfr5 |
| xfr8 | xfr7 |
| xfr10 | xfr9 | ······ 544 ··· CRC-G0
| xfr12 | xfr11 |
| xfr14 | xfr13 |
| xfr16 | xfr15 | ⟵ 2nd LTP State
| xfr18 | xfr17 |
| xfr20 | xfr19 |
| xfr22 | xfr21 |
| xfr24 | xfr23 | ······ 512 ··· CRC-G1
| xfr26 | xfr25 |
| xfr28 | xfr27 |
| xfr30 | xfr29 |
| xfr32 | xfr31 |

*Fig. 27*

| Lane0[31:0] |
|:---:|
| xfr0 |
| xfr1 |
| xfr2 |
| xfr3 |
| xfr4 |
| xfr5 |
| xfr6 |
| xfr7 |
| xfr8 |
| xfr9 |
| xfr10 |
| xfr11 |
| xfr12 |
| xfr13 |
| xfr14 |
| xfr15 |
| xfr16 |
| xfr17 |
| xfr18 |
| xfr19 |
| xfr20 |
| xfr21 |
| xfr22 |
| xfr23 |
| xfr24 |
| xfr25 |
| xfr26 |
| xfr27 |
| xfr28 |
| xfr29 |
| xfr30 |
| xfr31 |
| xfr32 |

*Fig. 28*

LANE ERROR DETECTION AND LANE REMOVAL MECHANISM TO REDUCE THE PROBABILITY OF DATA CORRUPTION

BACKGROUND INFORMATION

High-performance computing (HPC) has seen a substantial increase in usage and interests in recent years. Historically, HPC was generally associated with so-called "Super computers." Supercomputers were introduced in the 1960s, made initially and, for decades, primarily by Seymour Cray at Control Data Corporation (CDC), Cray Research and subsequent companies bearing Cray's name or monogram. While the supercomputers of the 1970s used only a few processors, in the 1990s machines with thousands of processors began to appear, and more recently massively parallel supercomputers with hundreds of thousands of "off-the-shelf" processors have been implemented.

There are many types of HPC architectures, both implemented and research-oriented, along with various levels of scale and performance. However, a common thread is the interconnection of a large number of compute units, such as processors and/or processor cores, to cooperatively perform tasks in a parallel manner. Under recent System on a Chip (SoC) designs and proposals, dozens of processor cores or the like are implemented on a single SoC, using a 2-dimensional (2D) array, torus, ring, or other configuration. Additionally, researchers have proposed 3D SoCs under which 100's or even 1000's of processor cores are interconnected in a 3D array. Separate multicore processors and SoCs may also be closely-spaced on server boards, which, in turn, are interconnected in communication via a backplane or the like. Another common approach is to interconnect compute units in racks of servers (e.g., blade servers and modules) that are typically configured in a 2D array. IBM's Sequoia, alleged to be the world's fastest supercomputer, comprises a 2D array of 96 racks of server blades/modules totaling 1,572,864 cores, and consumes a whopping 7.9 Megawatts when operating under peak performance.

One of the performance bottlenecks for HPCs is the latencies resulting from transferring data over the interconnects between compute nodes. Typically, the interconnects are structured in an interconnect hierarchy, with the highest speed and shortest interconnects within the processors/SoCs at the top of the hierarchy, while the latencies increase as you progress down the hierarchy levels. For example, after the processor/SoC level, the interconnect hierarchy may include an inter-processor interconnect level, an inter-board interconnect level, and one or more additional levels connecting individual servers or aggregations of individual servers with servers/aggregations in other racks.

It is common for one or more levels of the interconnect hierarchy to employ different protocols. For example, the interconnects within an SoC are typically proprietary, while lower levels in the hierarchy may employ proprietary or standardized interconnects. The different interconnect levels also will typically implement different Physical (PHY) layers. As a result, it is necessary to employ some type of interconnect bridging between interconnect levels. In addition, bridging may be necessary within a given interconnect level when heterogeneous compute environments are implemented.

At lower levels of the interconnect hierarchy, standardized interconnects such as Ethernet (defined in various IEEE 802.3 standards), and InfiniBand are used. At the PHY layer, each of these standards support wired connections, such as wire cables and over backplanes, as well as optical links. Ethernet is implemented at the Link Layer (Layer 2) in the OSI 7-layer model, and is fundamentally considered a link layer protocol. The InfiniBand standards define various OSI layer aspects for InfiniBand covering OSI layers 1-4.

Current Ethernet protocols do not have any inherent facilities to support reliable transmission of data over an Ethernet link. This is similar for the link-layer implementation of InfiniBand. Each address reliable transmission at a higher layer, such as TCP/IP. Under TCP, reliable delivery of data is implemented via explicit ACKnowledgements (ACKs) that are returned from a receiver (at an IP destination address) to a sender (at an IP source address) in response to receiving IP packets from the sender. Since packets may be dropped at one of the nodes along a route between a sender and receiver (or even at a receiver if the receiver has inadequate buffer space), the explicit ACKs are used to confirm successful delivery for each packet (noting that a single ACK response may confirm delivery of multiple IP packets). The transmit-ACK scheme requires significant buffer space to be maintained at each of the source and destination devices (in case a dropped packet or packets needs to be retransmitted), and also adds additional processing and complexity to the network stack. For example, as it is possible for an ACK to be dropped, the sender also employs a timer that is used to trigger a retransmission of a packet for which an ACK has not been received within the timer's timeout period. Each ACK consumes precious link bandwidth and creates additional processing overhead. In addition, the use of timers sets an upper limit on link round trip delay.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 5 is a diagram illustrating the data structure of a standard detection LTP, according to one embodiment;

FIG. 6 is a diagram illustrating the data structure of a 14-bit CRC LTP, according to one embodiment;

FIG. 7 is a diagram illustrating the data structure of an enhanced detection LTP, according to one embodiment;

FIG. 8 is a diagram illustrating the data structure of a standard detection Null LTP, according to one embodiment;

FIG. 9a is a diagram illustrating an embodiment of a transmission scheme for a 4-lane link under which flits for a standard detection LTP are processed two at a time in parallel at an interface between the Link Fabric and Link Transfer sub-layers, according to one embodiment;

FIG. 9b is a diagram illustrating an embodiment of a transmission scheme for a 4-lane link under which flits for an enhanced detection LTP are processed two at a time in parallel at the interface between the Link Fabric and Link Transfer sub-layers, according to one embodiment;

FIGS. 18a and 18b are schematic diagram illustrating transmission of an LTP transmit scheme and use of per-lane CRCs and LTP CRCs to detect LTP lanes and errant lanes, wherein FIG. 18a depicts an original transmission of LTPs in the LTP transmit scheme and FIG. 18b depicts retransmission of LTPs in the LTP transmit stream using a replay buffer, according to one embodiment;

FIG. 19 is a diagram illustrating transmission of a standard detection LTP using 33 transfer groups (XFRs), according to one embodiment;

FIG. 20 is a diagram illustrating transmission of LTPs across a 4-lane link using 33 32-bit XFRs and four LTP sequence states, according to one embodiment;

FIG. 27 is a diagram illustrating transfer of a standard detection LTP over two lanes under which 17 XFRs are transferred one of the lanes and 16 XFRs are transmitted over the other lane, and employing two LTP sequence states, according to one embodiment;

FIG. 28 is a diagram illustrating transmission of a standard detection LTP over a single lane using 33 32-bit XFRs, according to one embodiment.

DETAILED DESCRIPTION

Figure 1:
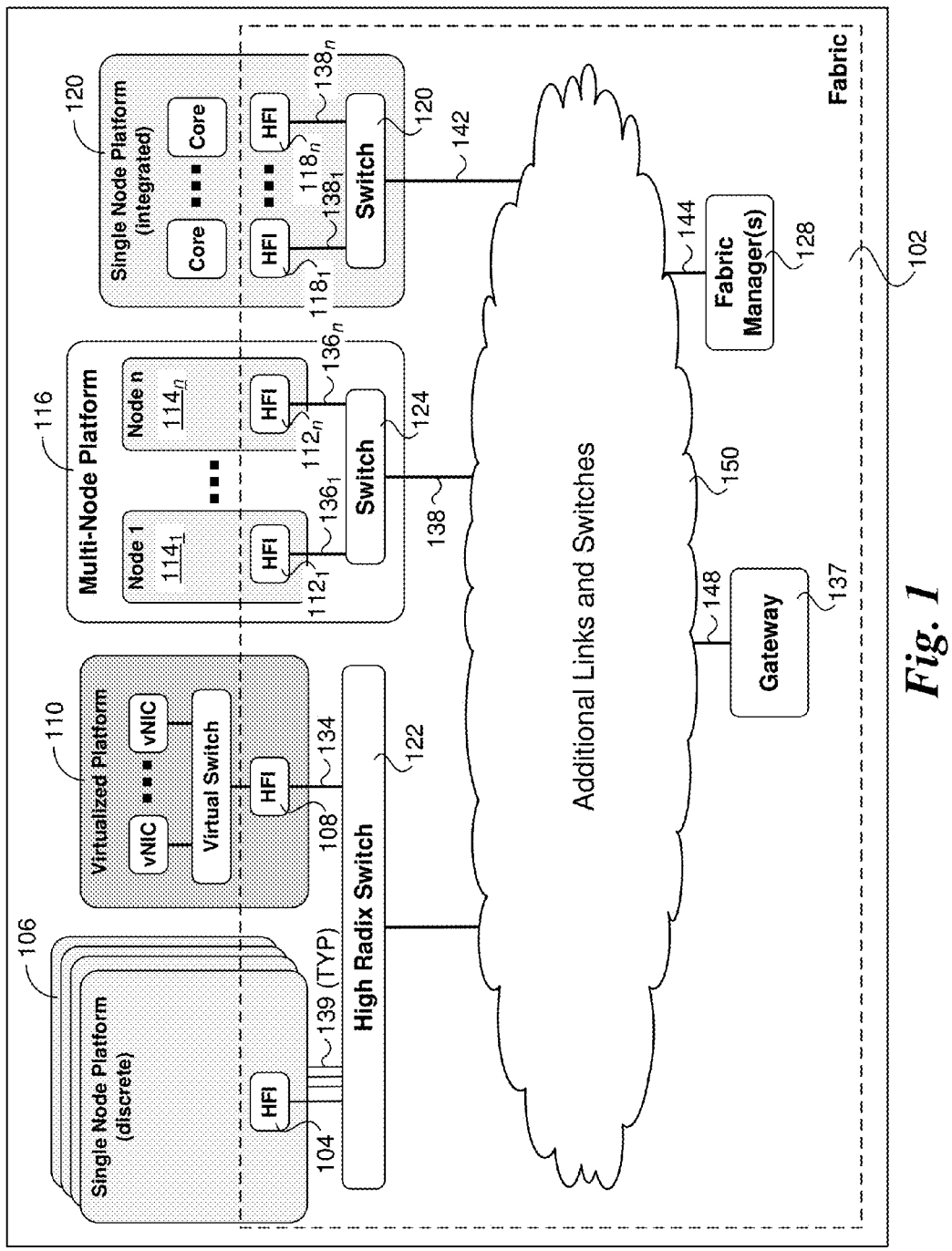
FIG. 1 is a schematic diagram illustrating a high-level view of a system comprising various components and interconnects of the fabric architecture, according to one embodiment.

Embodiments of methods and apparatus for implementing a lane error detection and lane removal mechanism to reduce the probability of data corruption in multi-lane links are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity. Conversely, "(typ)" is not to be construed as meaning the component, element, etc. is typically used for its disclosed function, implement, purpose, etc.

In accordance with aspects of the embodiments described herein, an architecture is provided that defines a message passing, switched, server interconnection network. The architecture spans the OSI Network Model Layers 1 and 2, leverages IETF Internet Protocol for Layer 3, and includes a combination of new and leveraged specifications for Layer 4 of the architecture.

The architecture may be implemented to interconnect CPUs and other subsystems that comprise a logical message passing configuration, either by formal definition, such as a supercomputer, or simply by association, such a group or cluster of servers functioning in some sort of coordinated manner due to the message passing applications they run, as is often the case in cloud computing. The interconnected components are referred to as nodes. The architecture may also be implemented to interconnect processor nodes with an SoC, multi-chip module, or the like. One type of node, called a Host, is the type on which user-mode software executes. In one embodiment, a Host comprises a single cache-coherent memory domain, regardless of the number of cores or CPUs in the coherent domain, and may include various local I/O and storage subsystems. The type of software a Host runs may define a more specialized function, such as a user application node, or a storage or file server, and serves to describe a more detailed system architecture.

At a top level, the architecture defines the following components:
Host Fabric Interfaces (HFIs);
Links;
Switches;
Gateways; and
A comprehensive management model.

Host Fabric Interfaces minimally consist of the logic to implement the physical and link layers of the architecture, such that a node can attach to a fabric and send and receive packets to other servers or devices. HFIs include the appropriate hardware interfaces and drivers for operating system and VMM (Virtual Machine Manager) support. An HFI may also include specialized logic for executing or accelerating upper layer protocols and/or offload of transport protocols. An HFI also includes logic to respond to messages from network management components. Each Host is connected to the architecture fabric via an HFI.

Links are full-duplex, point-to-point interconnects that connect HFIs to switches, switches to other switches, or switches to gateways. Links may have different physical configurations, in circuit board traces, copper cables, or optical cables. In one embodiment the implementations the PHY (Physical layer), cable, and connector strategy is to follow those for Ethernet, specifically 100 GbE (100 gigabits per second Ethernet, such as the Ethernet links defined in IEEE 802.3bj draft standard (current draft 2.2)). The architecture is flexible, supporting use of future Ethernet or other link technologies that may exceed 100 GbE bandwidth. High-end supercomputer products may use special-purpose (much higher bandwidth) PHYs, and for these configurations interoperability with architecture products will be based on switches with ports with differing PHYs.

Switches are OSI Layer 2 components, and are managed by the architecture's management infrastructure. The architecture defines Internet Protocol as its OSI Layer 3, or Inter-networking Layer, though the architecture does not specify anything in the IP domain, nor manage IP-related devices. Devices that support connectivity between the architecture fabric and external networks, especially Ethernet, are referred to as gateways. Lightweight gateways may offer reduced functionality and behave strictly at Ethernet's layer 2. Full featured gateways may operate at Layer 3 and above, and hence behave as routers. The Gateway specifications provided by the architecture include mechanisms for Ethernet encapsulation and how gateways can behave on the fabric to permit flexible connectivity to Ethernet data center networks consistent with the rest of the architecture. The use of IP as the inter-networking protocol enables IETF-approved transports, namely TCP, UDP, and SCTP, to be used to send and receive messages beyond the architecture's fabric.

FIG. 1 shows a high-level view of a system 100 illustrating various components and interconnects of the architecture, according to one embodiment. A central feature of the architecture is the fabric 102, which includes a collection of the HFIs and gateways interconnected via the architectures links and switches. As depicted in FIG. 1, the fabric 102 components includes multiple HFIs 104 (one is shown), each hosted by a respective discrete single node platform 106, an HFI 108 hosted by a virtual platform 110, HFIs $112_1$ and $112_n$ hosted by respective nodes $114_1$ and $114_n$ of a multi-node platform 116, and HFIs $118_1$ and $118_n$ of an integrated single node platform 120, a high radix switch 122, switches 124 and 126, fabric manager(s) 128, a gateway 130, links 132, 134, $136_1$, $136_n$, 138, $140_1$, $140_n$, 142, 144, 148, and additional links and switches collectively shown as a cloud 150.

As discussed above, switches are a Layer 2 devices and act as packet forwarding mechanisms within a fabric. Switches are centrally provisioned and managed by the fabric management software, and each switch includes a management agent to respond to management transactions. Central provisioning means that the forwarding tables are programmed by the fabric management software to implement specific fabric topologies and forwarding capabilities, like alternate routes for adaptive routing. Switches are responsible for executing QoS features such as adaptive routing and load balancing, and also implement congestion management functions.

Figure 2:
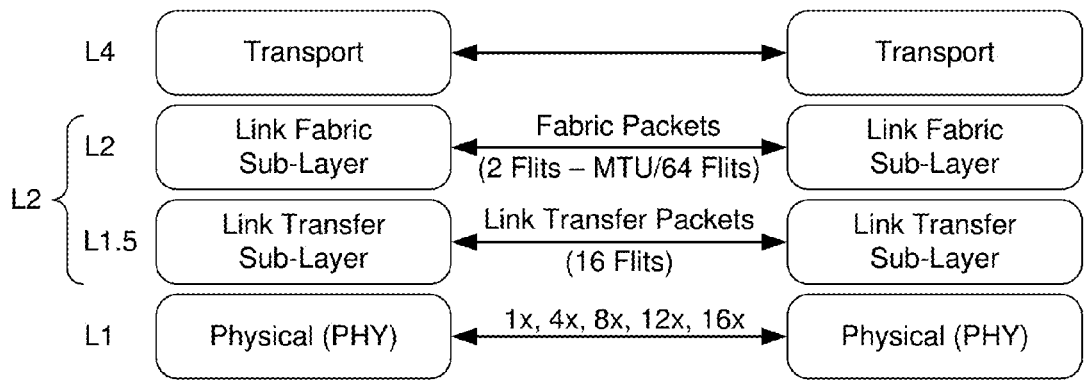
FIG. 2 is a schematic diagram depicting the architecture's layers for transferring data over the fabric links, according to one embodiment.

FIG. 2 depicts the architecture's layers for transferring data over the fabric links. The layers include a Physical (PHY) Layer, a Link Transfer Sub-Layer, a Link Fabric Sub-Layer, and a Transport Layer. At the left of FIG. 2 is the mapping of the layers to the OSI reference model under which the PHY Layer maps to Layer 1 (PHY Layer), the Link Transfer Sub-Layer and Link Fabric Sub-Layer collectively map to Layer 2 (Link Layer), and the Transport Layer maps to Layer 4 (Transport Layer).

In the architecture, signals are grouped together in the Physical Layer into ports, which behave, can be controlled, and are reported as a monolithic entity. A port comprises one or more physical lanes, wherein each lane consists of two differential pairs or fibers implemented in the physical transmission medium, one for each direction of communication. The number of lanes that comprise a port is implementation-dependent; however, the architecture of the Link Transfer Sub-layer supports a finite set of port widths. Specific port widths are supported as fundamental port widths, to allow for common targets for cable and chip design. The port widths include 1x, 4x, 8x, 12x, and 16x, where "x" identifies the number of physical lanes. Under some circumstances, such as detection of a defective lane, links may run at reduced lane widths.

Figure 3:
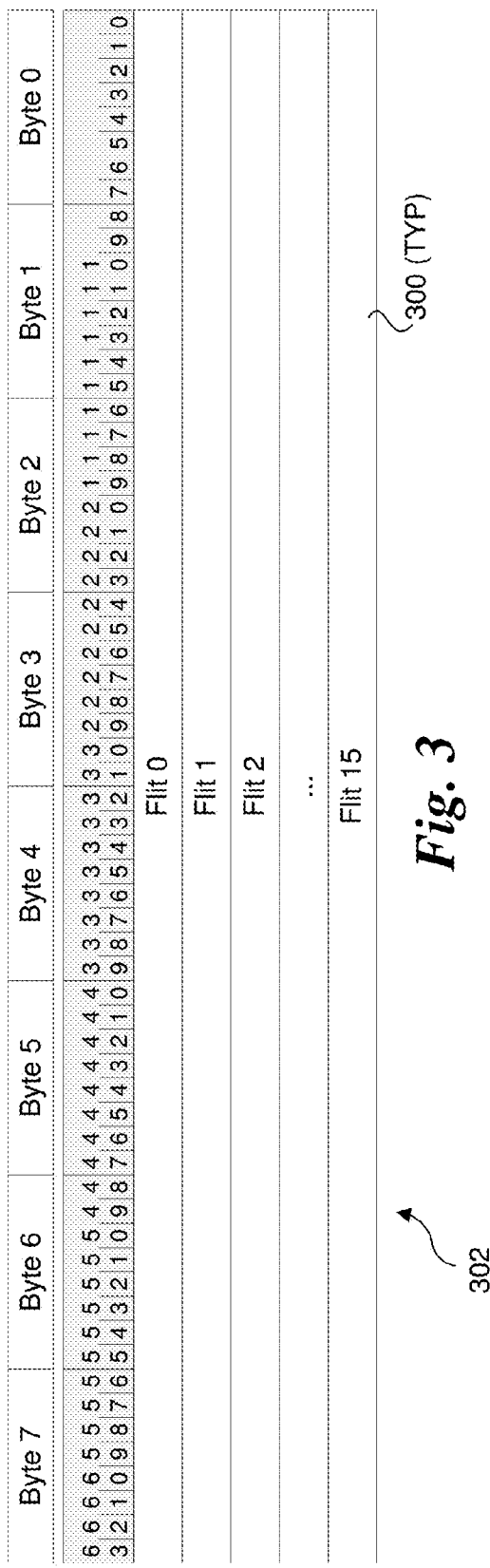
FIG. 3 is a schematic diagram illustrating a plurality of flits grouped in a bundle.

The Link Transfer Sub-Layer serves as the interface between the Physical Layer and the Link Fabric Sub-Layer. The link Fabric Packets (at the Link Fabric Sub-Layer) are segmented into 64-bit Flow Control Digits (FLITs, Flits, or flits, an approximate contraction of Flow Control Digits). FIG. 3 illustrates an example of a plurality of flits 300 grouped in a bundle 302. Each flit 300 includes 64 data bits comprising 8 bytes of data.

The Link Transfer Sub-Layer forms multiple lanes into teams that are capable of transferring flits and their associated credit return information across the link in a reliable manner. This is accomplished using 1056-bit bundles called Link Transfer Packets (LTPs), which are associated with the Link Fabric Sub-Layer. FIG. 3 also depicts the data portion of an LTP, which includes 16 flits of data. In addition, LTPs include flit type information, CRC data, and optional data (not shown in FIG. 3). Examples of LTPs are illustrated in various Figures (e.g., 5-11) and described below in further detail.

Figure 4:
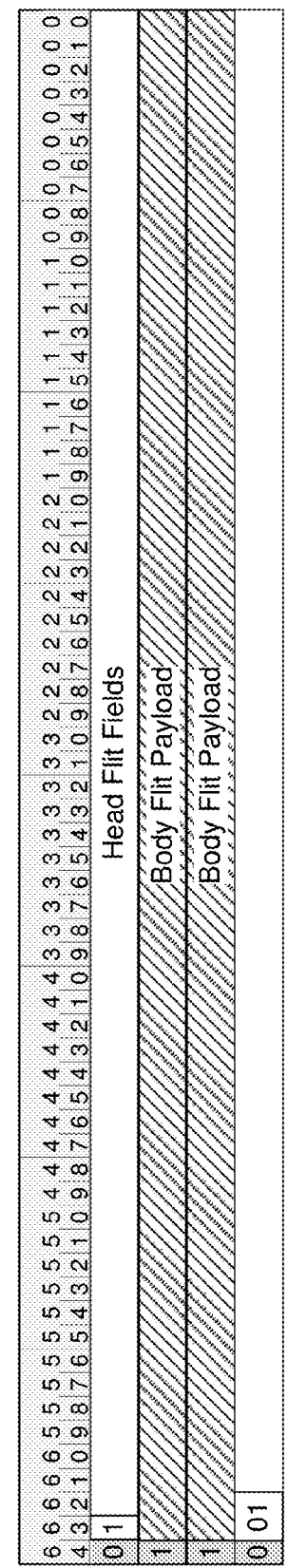
FIG. 4 is a schematic diagram illustrating the structure of a Fabric Packet, according to one embodiment.

Fabric Packets are composed of 64-bit flits and a flit type bit for each flit. The first data flit of a Fabric Packet is called the Head flit. The last data flit of a Fabric Packet is called the Tail flit. Any other data flits in a Fabric Packet are called body flits. An example of a Fabric Packet 400 is illustrated in FIG. 4.

The flit type bit is provided with each flit to distinguish body flits from other flit types. In one embodiment, Body flits are encoded with the flit type bit set to 1, and contain 64 bits of data. All other flits are marked with the type bit set to 0. Head flits are encoded with flit[63] set to 1. All other (non body) flits are encoded with flit[63] set to 0. Tail flits are encoded with flit[62] set to 1. All other (non body/head) flits are encoded with flit[62] set to 0. Flit encoding is summarized in TABLE 1 below.

TABLE 1

| Flit Type Bit | Flit[63] | Flit[62] | Description |
|---|---|---|---|
| 1 | X | X | Body Data Flit |
| 0 | 0 | 0 | idle, bad packet, and control flits. |
| 0 | 0 | 1 | Tail Data Flit |
| 0 | 1 | X | Head Data Flit |

The control flits are summarized in TABLE 2. The seven control flits used solely by the link transfer layer (LT control Flits) are sent in null LTPs. The remaining control flits are divided into two groups. Fabric Packet (FP) flits include HeadBadPkt, BodyBadPkt and TailBadPkt control flits as well as the normal packet Head, Body, and Tail flits. Link Fabric (LF) command flits include Idle, VLMrkr and CrdtRet flits. FP flits and LF command flits can be intermingled together within reliable LTPs for transmission over the link.

TABLE 2

| Name | Generating | Sent in LTP | Flit Type | Description |
|---|---|---|---|---|
| Idle | both | Reliable | LF Command | Idle. |
| VLMrkr | Link Fabric | Reliable | LF Command | VL Interleave marker. |
| CrdtRet | Link Fabric | Reliable | LF Command | VL credit return. |
| TailBadPkt | both | Reliable | Fabric Packet | Tail bad packet. |
| BodyBadPkt | both | Reliable | Fabric Packet | Body flit in a fabric packet had an unrecoverable error internal to device |
| HeadBadPkt | both | Reliable | Fabric Packet | Head flit in a fabric packet had an unrecoverable error internal to device |
| Null | Link Transfer | Single Null LTP | LT Control | Null. |
| RetryReq | Link Transfer | Null LTP Pair | LT Control | Retransmit request. |
| RetryMrkr0 | Link Transfer | Single Null LTP | LT Control | First Retransmission marker in Pair. |
| RetryMrkr1 | Link Transfer | Single Null LTP | LT Control | Second Retransmission marker in Pair. |
| RndTripMrkr | Link Transfer | Null LTP Pair | LT Control | Round trip marker. |
| RetrainRetryReq | Link Transfer | Null LTP Pair | LT Control | Retrain retransmit request. |
| LinkWidthReq0 | Link Transfer | Null LTP Pair | LT Control | First Link width request in pair. For power management. |
| LinkWidthReq1 | Link Transfer | Null LTP Pair | LT Control | Second Link width request in pair. For power management. |

An idle command flit is used by the link fabric layer when there are no Fabric Packet flits to insert into the data stream. If the full width of the data path contains idles the link transfer layer will remove them from the flit stream that is inserted into the input buffer. If the data path contains both idles and non-idle flits, the idles will not be removed. This is implemented in order for the link transfer layer to present the identical data path composition the link fabric layer on the far side of the link. If the link transfer layer has no flits pending from the link fabric layer, it will insert idles as original flits are sent over the link. Original flits are flits sent over the link for the first time as opposed to those that are sent from a replay buffer which comprise retransmitted or replayed flits.

A link transfer packet holds sixteen flits for transmission over the link. Reliable LTPs are held in a replay buffer for period of time that is long enough to guarantee that a lack of a retransmit request indicates it has been received successfully by the link peer. Replay buffer location pointers are maintained for each LTP at the transmitter (NxtTxLTP) and receiver (NxtRxLTP) but are not exchanged as part of the LTP. When a transmission error is detected by the receiver, it sends a RetryReqLTP to the transmitter that contains the NxtRxLTP replay buffer location pointer. In response to receiving a RetryReqLTP, LTPs in the replay buffer are retransmitted in the original order, starting with the RetryReqLTP (peer NxtRxLTP) and ending with the last replay buffer location written (NxtWrLTP−1). Null LTPs are not held in the replay buffer and are not retransmitted.

Link Fabric command flits may be mixed with FP flits in an LTP; however, LF command flits are not part of a Fabric Packet. They carry control information from the Link Fabric sub-layer at one end of a link to the Link Fabric sub-layer at the other end of the link.

In one embodiment, there are three LTP formats, including a standard detection LTP, a 14-bit CRC LTP, and an enhanced Detection LTP. An embodiment of a standard detection LTP is shown in FIG. 5. In addition to the sixteen flits each standard detection LTP has a 16 bit CRC which covers the LTP contents. For illustrative purposes, the Flits in FIG. 5 are shown as 65 bits where bit 64 is the flit type bit.

An embodiment of a 14-bit CRC LTP is shown in FIG. 6. In addition to the sixteen flits, each 14-bit CRC LTP has a two bit credit sideband channel and a 14-bit CRC that covers the LTP contents. Flow control credits are transmitted within LTPs either in special LF command flits or in an LTP credit sideband channel.

In addition to the standard detection LTP, the link may also support an optional enhanced detection LTP holding sixteen flits and having four twelve bit CRC fields. FIG. 7 shows the format of an embodiment of the enhanced detection LTP. Each of the four CRC fields covers all sixteen flits. If any of the four CRCs are bad the LTP is retransmitted. There are two CRC calculation options for the four 12 bit CRCs. The first (48b overlapping) uses four overlapping calculations where each calculation covers all bits within the LTP. The second (12b-16b CRC per lane) uses four non-overlapping calculations where each calculation is limited to all the bits that flow on one of the four lanes.

As discussed above, LT control Flits used by the link transfer layer are sent in null LTPs. Null LTPs do not consume space in the replay buffer and are not retransmitted. They are distinguished using one of the link transfer LT control flits summarized in TABLE 2 above. Most of the null LTP types are sent in sequential pairs to guarantee that either at least one of the two is received by the link peer without an error or that a RetrainRetryReq will be automatically generated when they both have an error. An example of a standard detection null LTP is illustrated FIG. 8.

Standard detection null LTPs contain a single distinguishing control flit, 975 reserved bits and the standard detection sixteen bit CRC field. Enhanced detection null LTPs contain a single distinguishing control flit, 975 reserved bits and the enhanced detection four 12 bit CRC fields. The two sideband bits are ignored in a null LTP when using a 14 bit CRC.

Figure 10:
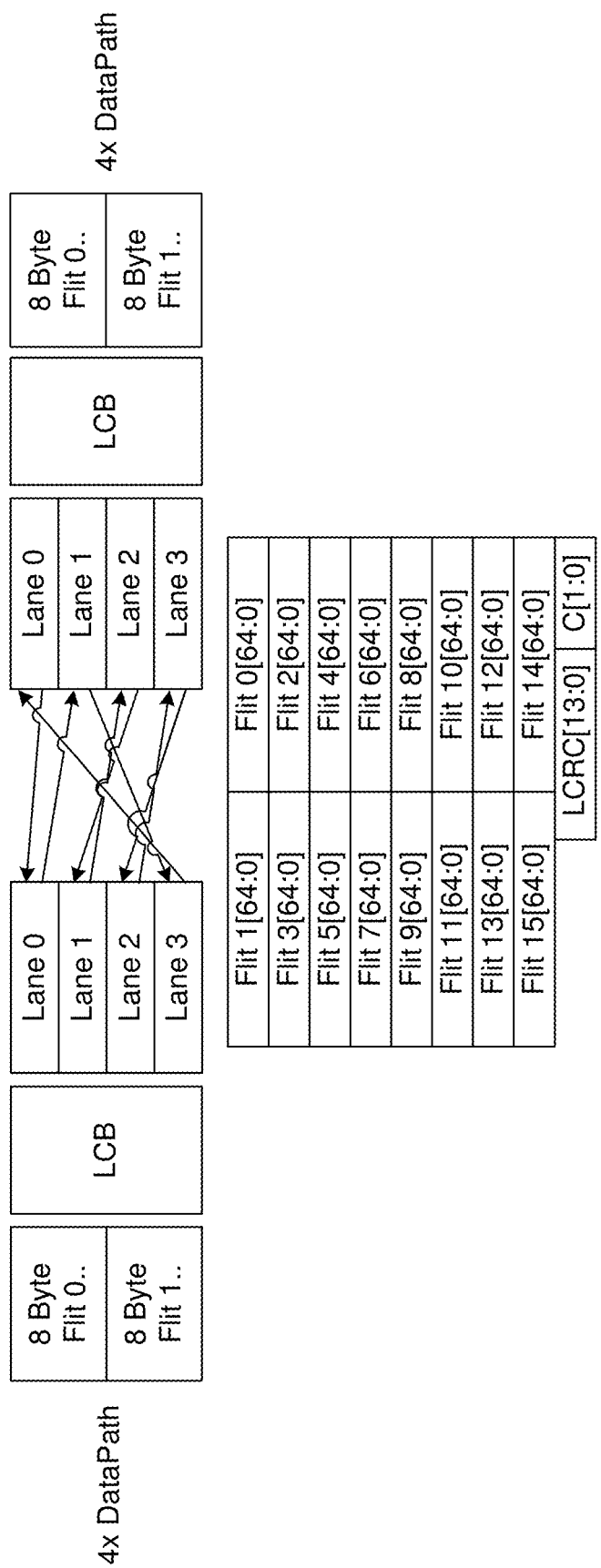
FIG. 10 is a schematic diagram illustrating transmission of a 14-bit CRC LTP with two control bits over a 4-lane link under which two flits are processed two at a time in parallel at the interface between the Link Fabric and Link Transfer sublayers according to one embodiment.

One LTP at a time is transmitted over the link for both a 4x capable port and an 8x capable port connected to a link with four lanes. This is illustrated using a link fabric data path perspective for both standard detection and enhanced detection LTPs in FIGS. 9a and 9b, respectively (noting the CRC fields are not to scale), while an embodiment of a corresponding signal processing and transfer paths is shown in FIG. 10. A 14-Bit CRC LTP would be similar to the standard detection LTP illustrated in FIG. 8, except the LCRC[15:0] field would be replaced with a combination of an LCRC[13:0] field and a C[1:0] field. The flit transmission order starts with flit 0 and ends with flit 15.

In one embodiment, the physical transmission of data over each lane employ a serial two-level bit non-return to zero (NRZ) encoded bit pattern, which data corresponding to each lane being decoded, deserialized, and grouped into 4 bytes per lane per cycle. This results in a transfer of 16 bytes comprising two flits per cycle. For example, the illustration in FIGS. 9a and 10 assumes an implementation-specific data path that is two flits wide, under which flit 0 and flit 1 would be transmitted at the same time, flit 2 and flit 3 would be transmitted at the same time, etc. The LCRC is calculated by the link transfer sub-layer.

Figure 11:
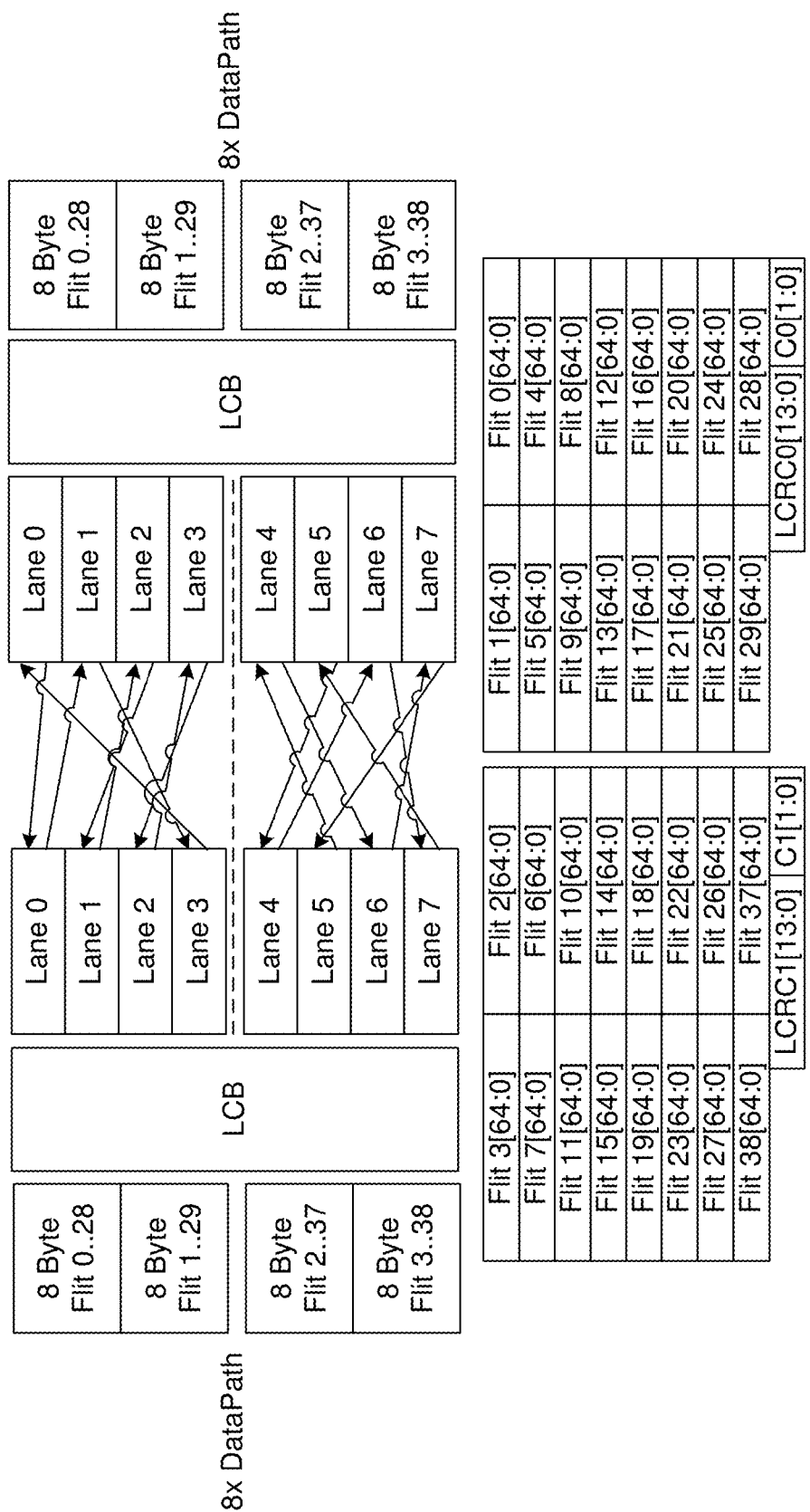
FIG. 11 is a schematic diagram illustrating transmission of two 14-bit CRC LTPs with two control bits in parallel over an 8 lane data path comprising two 4-lane links ganged together, according to one embodiment.

FIG. 11 shows an LTP transmission scheme under which two 4-lane links are ganged to support an 8x datapath under which data is transmitted over 8 lanes. As illustrated, under this scheme four flits from two LTPs are processed in parallel at the interface between the Link Fabric and Link Transfer sub-layers.

As discussed above, the architecture employs three levels of data unit granularity to support data transfers: Fabric Packets, flits, and Link Transfer Packets. The unit of transmission at the Link Transfer Layer, is an LTP. As depicted, each LTP is nominally 16 flits long, and as described above the actual size of an LTP may vary depending on the particular CRC scheme that is used, and the use of referring to an LTP of having a length of 16 flits corresponds to the number of 64-bit flits of data contained in the LTP excluding the CRC bits and the 16 bit 65's.

Figure 12:
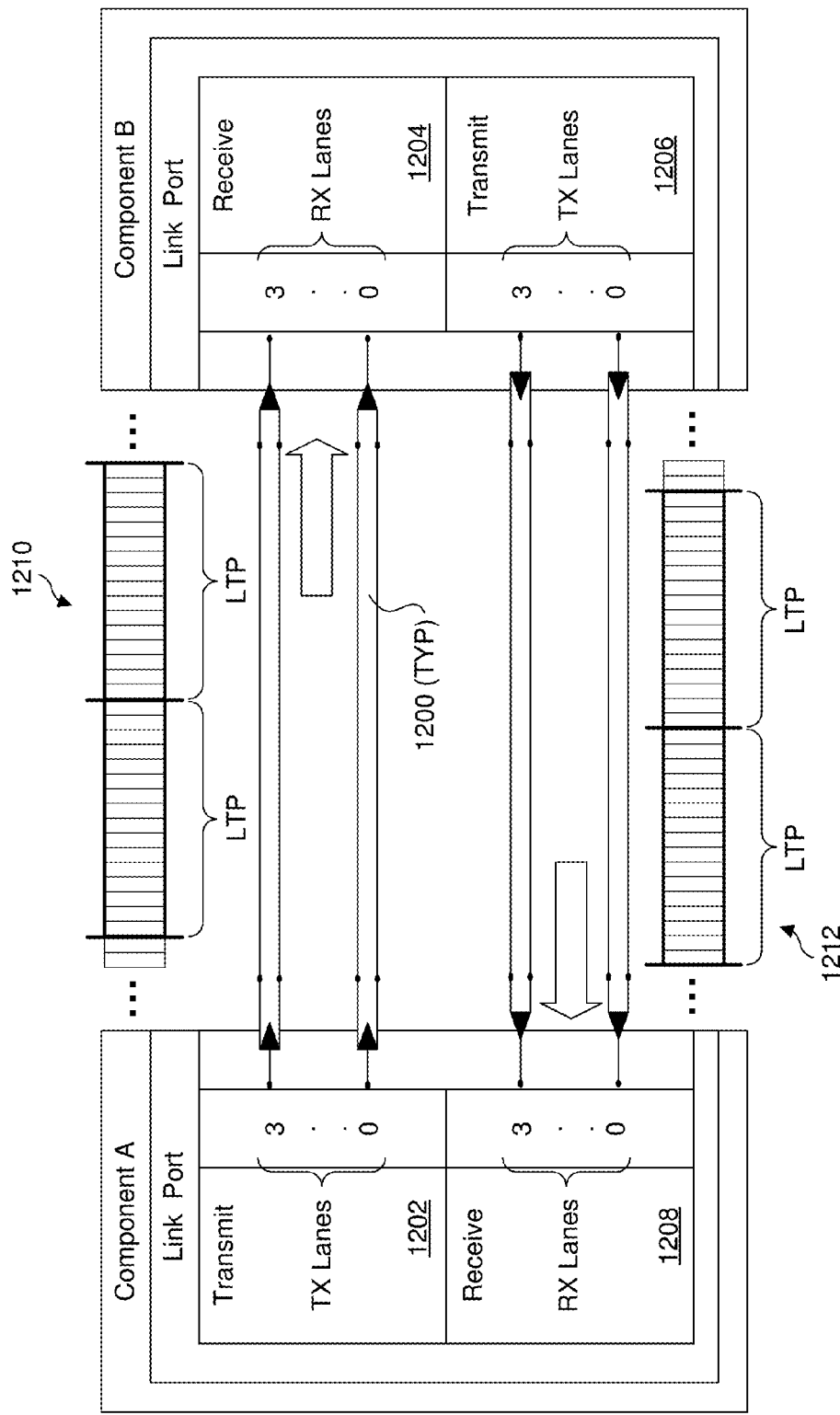
FIG. 12 a schematic diagram illustrating an example of bidirectional data transmission between two link ports employing 4 lanes, according to one embodiment.

The Physical layer (also referred to a "PHY") structure of one embodiment of a link comprising four physical lanes is illustrated in FIG. 12. The PHY defines the physical structure of the link interconnect and is responsible for dealing with details of operation of he signals on a particular link between two link peers, such as depicted by components A and B. This layer manages data transfer on the signal wires, including electrical levels, timing aspects, and logical issues involved in sending and receiving each bit of information across the parallel lanes. As shown in FIG. 12, the physical connectivity of each interconnect link is made up of four differential pairs of signals, 1200 comprising lanes 0-3 in each direction. Each port supports a link pair consisting of two uni-directional links to complete the connection between two peer components. This supports traffic in both directions simultaneously. For purposes of illustration and ease of understanding, the lane "swizzle" illustrated in FIG. 10 is not shown in FIG. 12; however, it will be understood that in some embodiments transmit and receive lanes are swizzled.

Components with link ports communicate using a pair of uni-directional point-to-point links, defined as link peers, as shown in FIG. 12. Each port comprises a Transmit (Tx) link interface and a Receive (Rx) link interface. For the illustrated example, Component A has a Tx port 1202 that is connected to Component B Rx port 1204. Meanwhile, Component B has a Tx port 1206 that is connected to Component A Rx port 1208. One uni-directional link transmits from Component A to Component B, and the other link transmits from Component B to Component A. The "transmit" link and "receive" link is defined relative to which component port is transmitting and which is receiving data. In the configuration illustrated in FIG. 12, the Component A transmit link transmits data from the Component A Tx port 1202 to the Component B Rx port 1204. This same Component A transmit link is the Port B receive link.

As previously stated, the fundamental unit for transfer of data between link ports is an LTP. Each LTP is specific to transmission in one direction over a specific link defined by a transmit port and a receive port at opposing ends of the link. An LTP has a lifetime of a single link transfer, and LTP's are dynamically generated by pulling flits from applicable VL buffers and assembling them, 16 at a time, into respective LTP's. As depicted by LTP transmit streams 1210 and 1212, LTPs are transmitted as a stream of flits, with the first and last flit for individual LTPs delineated by the head and tail flit bits, as discussed above with reference to FIG. 4.

As discussed above, the architecture defines a packet delivery mechanism primarily comprising destination-routed Fabric Packets, or FPs, with a Layer 4 payload size of 0 bytes to 10240 bytes. This provides efficient support for sending a range of messages from simple ULP acknowledgements to encapsulated Ethernet Jumbo Frames. Fabric Packets represent the logical unit of payload for ingress to and egress from an HFI. Fabric packets are so named because they have a lifetime that is end-to-end in a fabric. More specifically, the lifetime of a Fabric Packet is the time it takes transfer of the FP content between fabric end points, as defined by source and destination addresses for the FP. Each transfer path of an FP will include transfer across at least one link, and may include transfer across multiple links when the transfer path traverses one or more switches.

The use of flits in combination with FPs and LTPs facilitates data transfer functionality that is unique to the architecture. In particular, separation of FPs, flits, and LTPs support use of virtual lanes, as well as various aspects of QoS and fabric robustness.

Figure 15:
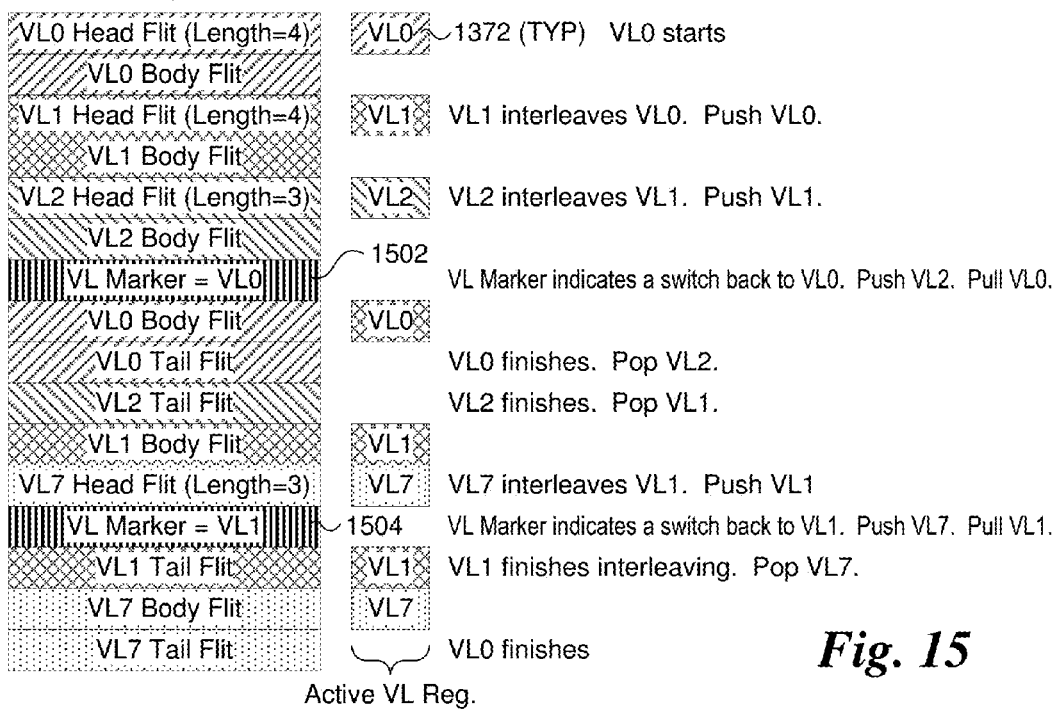
FIG. 15 is a diagram illustrating use of a combination of Push and Pop interleaving and use VL marker interleaving, according to one embodiment.
Figure 16:
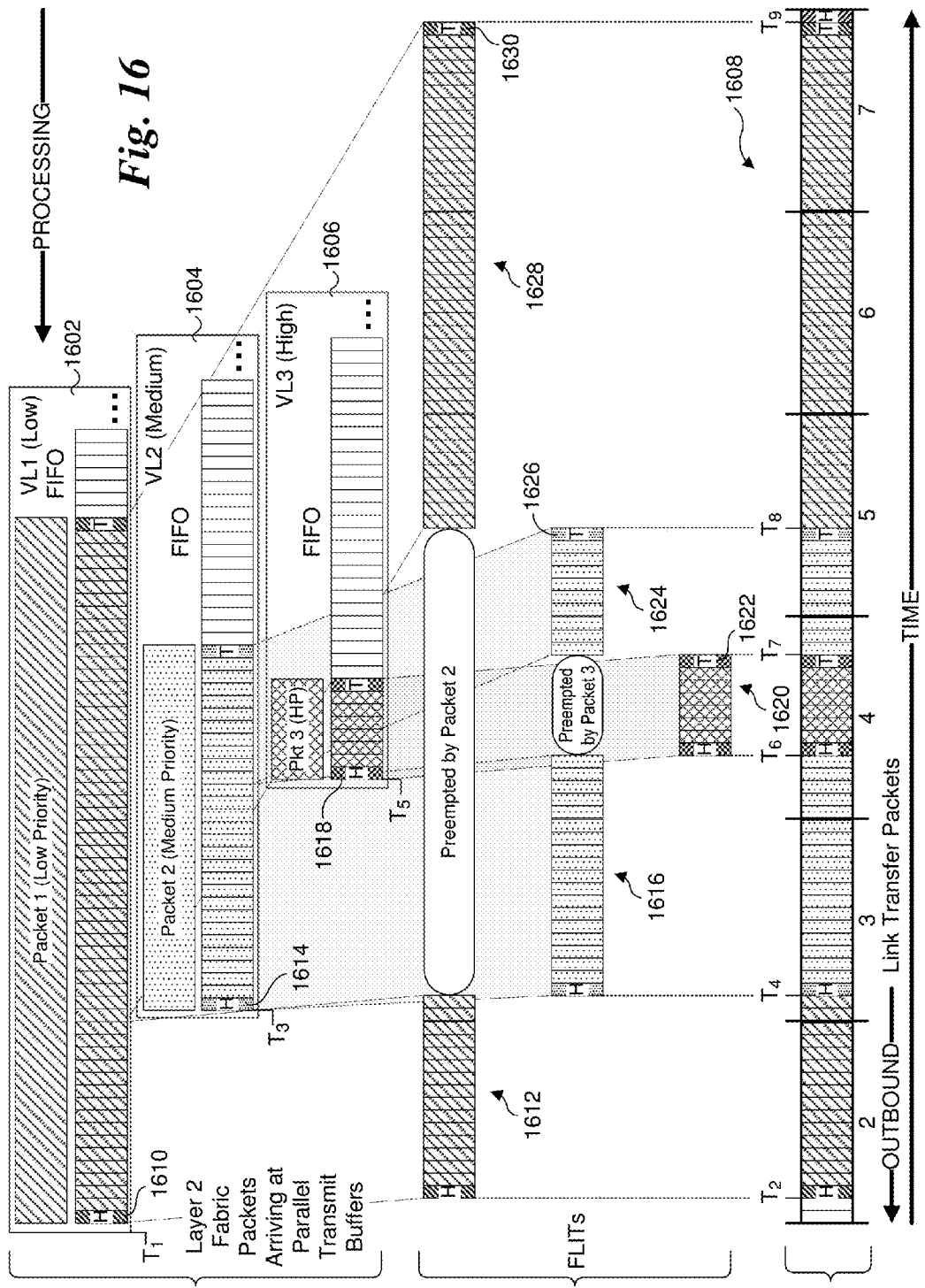
FIG. 16 is a combination schematic and timeflow diagram illustrating an example of preemptive interleaving of flits from three Fabric Packets buffered in three separate VL FIFOs corresponding to VLs having separate priority levels, according to one embodiment.

As discussed above, flits are not transmitted singularly, but are rather groups of 16 flits are packed (bundled) into Link Transfer Packets. This allows the flits to share a common link CRC. The flits in an LTP can come from many different Fabric Packets, which gives the link protocol some interesting characteristics compared to other fabrics. Through the use of an efficient packet preemption and interleaving mechanism, the architecture supports interleaving of the data transfers for different streams, virtually eliminating head-of-line blocking effects, even the blocking effect of a large single packet being physically transferred on a physical link. An illustration of the relationship between Fabric Packets, flits, and LTPs is shown in FIGS. 15 and 16, with further description of these figures described below.

The architecture uses credit-based flow control to manage the buffer resources at the receiver's side of the link and control when a transmitter may send flits. Under this approach, for a fabric port to send a flit it needs sufficient flow control credits available for the required buffer space at the receiving port. In one embodiment, receivers provide a single pool of receive buffers for the Virtual Lanes (VLs) supported on a link. The allocation of the buffer pool is managed by logic on the transmitter side of the link. Dedicated buffers are allocated for each supported VL. In addition, transmitters may manage a portion of the space as a shared pool to be allocated dynamically among the VLs. Credit-based flow control means that data transfer on the links are rigidly managed; there are no unauthorized data transfers, and it also means that the fabric is a so-called "lossless" fabric. In this case lossless means simply that during normal operations flits, and therefore packets, are never dropped due to congestion.

Control information, such as flow control credits, is carried in Link Fabric (LF) Command flits and Link Transfer (LT) Control Flits. LF Command and LT Control flits may be inserted at any point in the transmitter's flit stream. In addition, sideband information in some LTP formats may be used to transfer credits with even less overhead. LF Command and LT Control flits are generated by a link transmitter and consumed by the link receiver.

The architecture includes CRCs for Link Transfer Packets and Fabric Packets to ensure data integrity. The architecture also provides link-level retry for LTPs that are not received correctly. LTP retry significantly improves the effective bit error rate of the link, and enables the use of PHY strategies that may trade lower power consumption for a slightly degraded physical BER. LTP retry is also helpful for large fabrics where the large number of links in the fabric necessitates much better per link BER characteristics in order to maintain an acceptable system level error rate.

Preemption and Interleaving

The L2 Link layer permits flits from different packets to be interleaved when they are sent across a link as long as the packets are in different VLs. One motivation for interleaving is to maximize the usage of a given link. If a sending packet for whatever reason is interrupted by bubbles, a second packet can then be interleaved into the channel instead of having it to sit idle. A second reason for interleaving, called preemption, is to have a higher-priority packet interrupting a lower priority packet that is being transferred to reduce the latency of the higher-priority packet.

Under interleaving, all or a portion of a Fabric Packet's flits are interleaved with flits from other FPs within the stream of flits transmitted across the link. A transmitter selects flits for transmission from among the FPs available to send at a port's output queue. In one embodiment, FPs within a single VL are delivered in order, so within a Virtual Lane all of the flits from one packet are transmitted before any flit from a subsequent packet (in that VL) is transmitted. Across different VLs there is no ordering specified, so flits from packets in different VLs may be arbitrarily interleaved within the flit stream (as well as within a given an LTP, as long as ordering of flits is maintained within each VL). Some transmitter implementations may choose to limit the amount of interleaving between packets.

Under preemption, flits from a Fabric Packets with a higher priority level preempt flits from FPs with a lower priority level. In one embodiment, each Virtual Lane is associated with a respective priority level. Transmitters are configured to insert flits from higher priority VLs onto the link LTPs ahead of flits from lower priority VLs. Transmitters may choose to insert the higher priority flits at boundaries larger than a single flit. Additionally, transmitters may choose to interleave flits from VLs of the same priority, or they may inject all of the flits from one packet onto the link before sending flits from a different packet in a different VL of the same priority.

The receiver on a link separates the incoming flit stream by VL for insertion into queues and for forwarding to the next hop (for receivers in switches). Generally, for at least a given link, the Receiver implementation will support the full scope of interleaving that may be generated by a Transmitter. In some embodiments, a similar scope of interleaving is implemented across the fabric. Optionally, different links may support different levels of interleaving.

In accordance with aspects of packet preemption, flits from Packet B on a VL having a first priority level (e.g., high priority) may preempt a stream of flits from Packet A on a lower priority VL (that is, a VL having a lower priority level than the first priority level). In this case, the head flit of Packet A and zero or more body flits from Packet A may be followed by the head flit from Packet B. This head flit indicates a new packet is starting and the receiver will look for the SC field in the L2 header to determine the VL identifier. Packet B's head flit will be followed by zero or more body flits and finally the tail flit terminating Packet B. After the termination of Packet B, the transmission of Packet A is resumed with zero or more body flits followed by a tail flit.

Packet preemptions may be nested as packets are preempted by successively higher priority packets (packets on successively higher priority VLs). In one embodiment, this is modeled as a linked list with the active packet on the head of the list. When the current packet is preempted the new packet is added to the head of the list. When a preempting packet terminates it is removed from the list and the next expected packet to resume is the new head of the list. The maximum number of packets that may be held on the list at one time is equal to the number of supported VLs.

While the preceding discussion uses priority levels to describe preemption, there is no requirement that preemption be used only for higher priority packets. There may be cases where there are no flits from the current packet available for transmission (resulting in a "bubble"), yet there is a head flit available from a lower priority packet. The head flit and successive body flits from the lower priority packet may be sent. The new head flit will cause the packet to be added at the head of the list and the receiver will accurately track the new packet.

Figure 13:
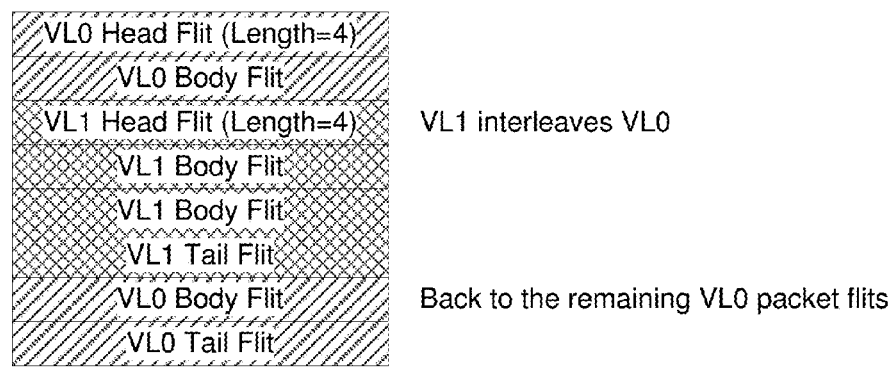
FIG. 13 is a diagram illustrating an example of an embodiment of interleaving Fabric Packet flits from two FPs sent over separate virtual lanes.

A packet is considered interleaved by a second packet when the Head flit of the second packet is sent before the Tail flit of the first packet. In the simplest case of interleaving, all Body flits following the interrupting Head flit belongs to the second packet until its Tail flit, after which the remaining packet flits of the first packet resume. This simple case is graphically depicted in FIG. 13.

The group of flits correspond to an order (top to bottom) of flits in a flit stream. The first flit in the group is the Head flit for a Fabric Packet being transferred over Virtual Lane 0, which is labeled VL0. The VL0 head flit identifies that FP as being 4 flits long (a Head Flit, two body flits, and a Tail flit). The second flit is the first body flit of FP VL0. The next flit is labeled VL1 Head flit, and it is the Head flit for an FP sent over Virtual Lane 1, which is labeled VL1. The VL1 Head flit also identifies this FP as being 4 flits long. Under one approach, when flits of an FP from a new VL are to be interleaved with flits from a current VL, the new VL becomes the active virtual lane for sending flits over the link. This is depicted by adding the Head flit for VL1 to the flit stream. As a result, FP VL1 interleaves FP VL0, which is depicted by first adding the VL1 Head flit, two VL1 body flits, and the VL1 Tail flit. The Tail flit identifies the end of the flits for the FP VL1 FP, which also completes the FP VL1 interleaving. The logic then returns to the FP flits prior to the VL1 interleave, resulting in the remaining FP VL0 body flit and Tail flit being sent out over the link.

Figure 14:
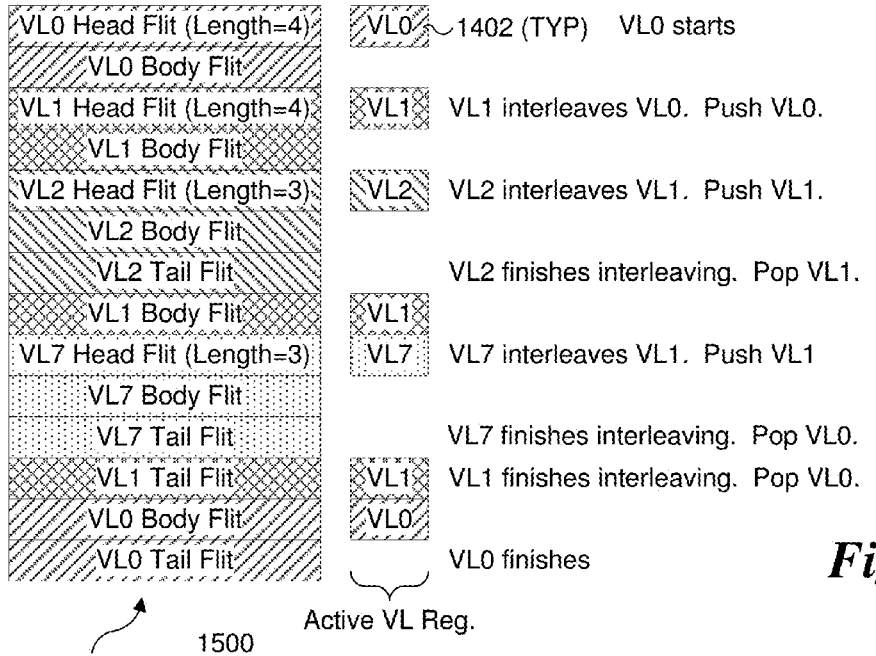
FIG. 14 is a diagram illustrating use of Push and Pop interleaving, according to one embodiment.

To further illustrate how the Link Fabric Sub-Layer supports interleaving of flits from multiple Fabric Packets, FIG. 14 shows an example of Push and Pop interleaving. Interleaving in the Link Fabric Sub-Layer utilizes a push and pop scheme where an interrupting Head flit causes a push of the VL that is being interrupted and a pop of the VL in the stack when a Tail flit is encountered. To visualize how the stack works imagine a stack of papers in an inbox, along with a desk area that is used for working on a current paper. In the context of the Push and Pop interleaving, the stack of papers is referred to as the "stack" and the desk area corresponds to an active VL register in which data identifying the active virtual lane from which flits are being stored. When the VL that is being transmitted is switched in response to an interleave, the interleaved VL becomes the new active VL, while the previous active VL is pushed off the desk onto the top of the stack, hence the term 'push.' At the completion of the VL flits for an FP (e.g., when the Tail flit for the VL FP is added to the LTP transmit FIFO), the VL is removed from the desk area and the VL on top of the stack is "popped" off the stack onto the desk area, thus becoming the new active VL. This pushing and popping of VLs can continue in a nested manner. With the Link Fabric Sub-Layer supporting n VLs, the maximum number of packets that can be simultaneously interrupted is n−1.

In the example of FIG. 14, an ordered list of flits 1400 represent the order that flits from Fabric Packets stored in various VLs are added to an transmit stream of flits (or optionally, shows the order of flits in a flit stream that is received at a receive port). The following description concerns generation of an flit stream under which flits are added to an outbound stream that is bundled into LTPs (that is, LTPs to be 'injected' into the fabric). Indicia identifying the active VL are depicted at various states in an active VL register 1402. Under an initial state, indicia corresponding to VL0 is stored in active VL register 1402, indicating flits are added from the next Fabric Packet buffered for virtual lane VL0 (referred to as VL0 FP). Accordingly, the first two flits for VL0 FP are added to the flit transmit stream, at which point an interleaving event is detected initiating VL1 interleaving VL0. To accomplish this interleaving operation, indicia for VL1 replaces VL0 in the active VL register, pushing VL0 onto the stack. This switches the active virtual lane to VL1, adding the Head Flit and first body flit for the VL1 FP to the flit transmit stream. Next, in response to a second interleaving event, interleaving of VL2 with VL1 is initiated, loading VL2 into active VL register 1402 and pushing VL1 onto the stack. This results in adding all three flits for FP VL2 to the flit transmit stream. Adding the FP VL2 Tail flit completes the interleaving of VL2 with VL1, resulting in VL1 being popped off the stack into active VL register 1402. Another body flit for VL1 is added, followed by initiating VL7 interleaving VL1, which is effected by adding indicia for VL7 to active VL register 1402 and pushing VL1 back to the stack. The three flits corresponding to the entire VL7 FP are added to the flit transmit stream, completing the interleaving of VL7 with VL1 and popping VL1 off of the stack back into active VL register 1402. The Tail flit of the VL1 FP is added, completing the interleaving of VL1 and popping VL0 off the stack into active VL register 1402. This returns VL0 as the active VL, and the last two packets for the VL0 FP are added to the LTP transmit FIFO.

Instead of relying on the Pop for returning to an implicit VL that is being interrupted, the Link Fabric Sub-Layer allows a device to utilize a special LF command flit called the "VL Marker" to explicitly specify which VL is moved to the head of the list. The usage of the VL Marker is less efficient due to this extra marker flit, but it provides more flexibility for interleaving. The diagram in FIG. 15 illustrates this concept.

The VL Marker in effect allows a VL to be pulled from the default stack ordering, or a new VL that is not present in the stack to be moved to the top of the stack. The VLs that remain in the stack continues to follow the Push and Pop rules afterward. The usage of these two different mechanisms can be intermixed and are not exclusive. In the case of a particular VL being pulled from the stack and is then interleaved by another VL, it is pushed back onto the stack.

Returning to FIG. 15, the sequence of operations begins in a similar manner to the Push and Pop example of FIG. 14, wherein the initial active virtual lane is VL0 and the first two flits of the VL0 FP are added to a flit transmit stream 1500. Similar to above, next VL1 interleaves VL0 for two flits, and then VL2 interleaves VL1. However, prior to reaching the VL2 FP Tail flit, a VL marker 1502 is inserted into the flit transmit stream, indicating that VL0 is to become the new active VL. This results in VL0 being pulled from the stack and loaded into active VL register 1402, and pushes VL2 onto the top of the stack. The remaining two flits for VL0 are added to flit transmit stream 1500, finishing VL0, resulting in VL2 being popped off the stack into active VL register 1402. This adds the Tail flit for VL2, finishing VL2 and popping VL1 off the stack into active VL register 1402. Another VL1 body flit is added, following by initiation of VL7 interleaving VL1, which loads VL7 into active VL register 1402 and pushes VL1 from active VL register 1402 onto the stack. A second VL marker 1504 is next added to flit transmit stream 1500 to switch the active virtual lane back to VL1. This pushes VL7 onto the stack and pulls VL1 into active VL register 1402. The VL1 FP Tail flit is added, which completes interleaving of VL1, and VL7 is popped off the stack into active VL register 1402. The last two flits for the VL7 FP are then added.

Figure 17:
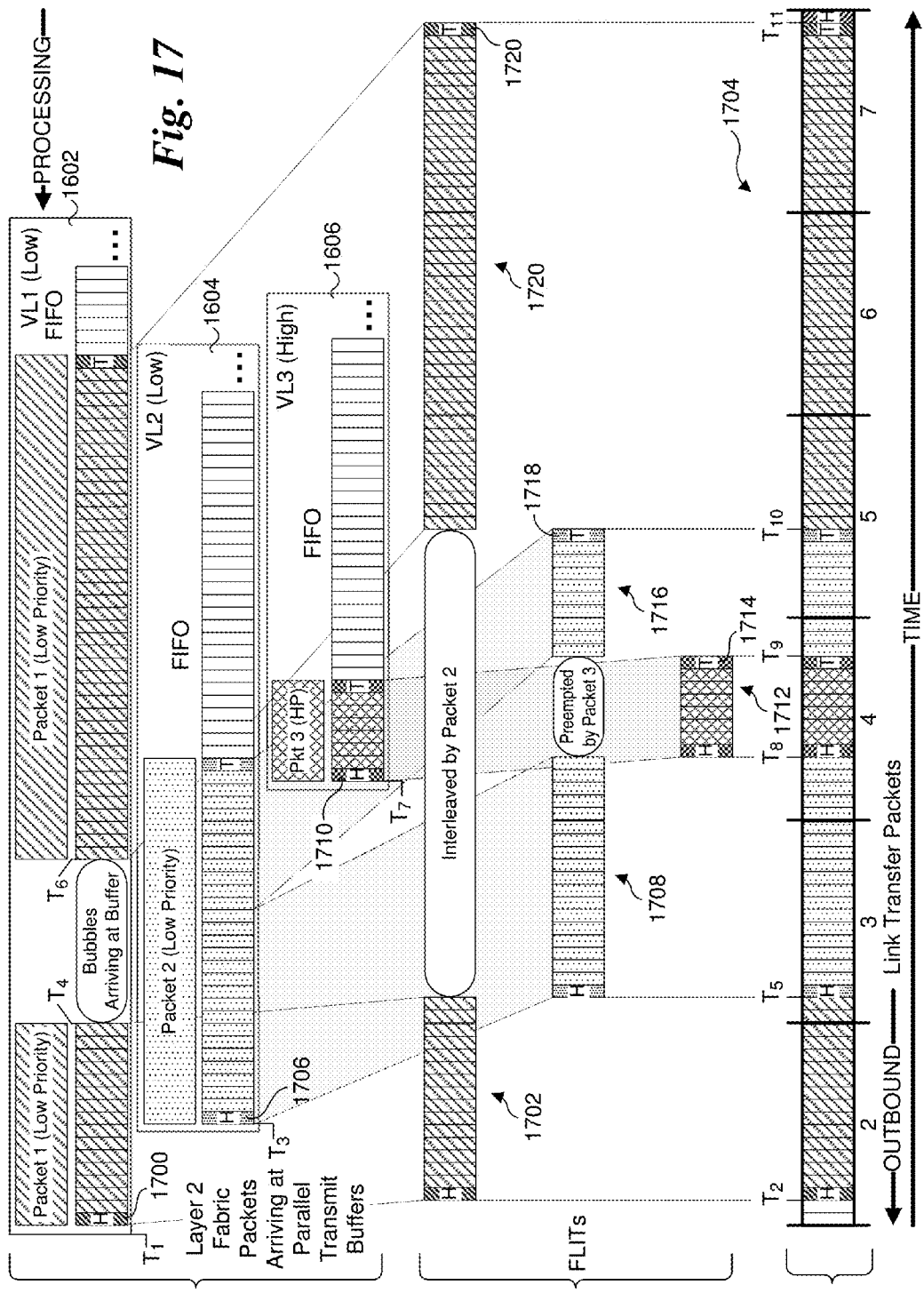
FIG. 17 is a combination schematic and timeflow diagram illustrating an example of bubble interleaving and preemptive interleaving of flits from three Fabric Packets buffered in three separate VL FIFOs under which two VLs share a priority level and the other VL having a higher priority level, according to one embodiment.

The interleaving examples shown in FIGS. 14 and 15 show an exaggerated level of interleaving for illustrative purpose, and for easier understanding of the Push and Pop interleaving scheme and the VL marker interleaving scheme. In an actual system, most interleaving will result from one of two types of interleaving events: (A) preemption; and (B) bubbles in packet streams. Further detailed examples of preemptive interleaving and a combination of preemptive interleaving and interleaving resulting from a bubble event are shown in FIGS. 16 and 17, respectively.

As described above, under preemption, content (flits) for a Fabric Packet in a virtual lane having higher priority may preempt the adding of flits of an FP in a lower-priority VL to the flit transmit stream. At an HFI, gateway, or other types of fabric endpoint, the data from which Fabric Packets are built will generally be initially buffered in some other type of format, such as an Ethernet frame that is to be encapsulated in a Fabric Packet. It is also likely that Fabric Packets may be created as part of a networking stack, similar to how Layer-3 packets such as IP packets and UDP packets are generated. At a switch, both the received and transmitted content is already formatted into flits, with additional metadata used to determine which flits are associated with which FPs, and what switch port the flits are to be sent outbound to their next hop or endpoint destination. In view of the foregoing, FIGS. 16 and 17 depict Fabric Packets as a whole, with the flit formatting of the FP content below the FPs.

The flit content for each FP is temporarily stored in a buffer allocated for the virtual lane to which the FP is assigned. Under various buffer configuration embodiments, separate buffers may be allocated to respective VLs, some VLs may share buffer space, or there may be a combination of the two, where a first portion of a VLs buffer allocation is private to that VL, while another portion is a shared buffer space.

A fundamental aspect of using virtual lanes is that content in a given virtual lane remain in order. This means that, for a given virtual lane, one FP may not pass another FP. Moreover, the flits for the FPs also remain in the order they are originally generated. At the same time, content in different virtual lanes does not have to remain in order relative to other virtual lanes. This enables higher priority traffic to preempt lower priority traffic. Virtual Lanes are also used to eliminate routing and protocol deadlocks, and to avoid head of line blocking between Traffic Classes.

As shown in FIG. 16, there are three buffers 1602, 1604, and 1606 for respective virtual lanes VL1, VL2, VL3. Each of these virtual lanes is also assigned a respective priority level—low priority for VL1, medium priority for VL2, and high priority for VL3. An arbiter (not shown) is used to determine from which VL buffer to pull flits to be added to a flit transmit stream 1608 in which flits are bundled into LTPs 2, 3, 4, 5, 6, and 7. FIG. 16 is a "sliding window" diagram depicted the processing of link traffic for VLs VL1, VL2, and VL3 over the depicted window timeframe. In one embodiment, VL buffers are implemented as FIFO (First-in, First-out) buffers, with each FIFO slot sized to store a flit.

As discussed above, under one aspect of preemptive interleaving, FP content assigned to a higher priority VL may preempt FP content assigned to a relatively lower priority VL. Generally, if FP content corresponding to multiple FPs are buffered in respective VL egress (to be injected into the fabric) buffers, the FP content assigned to the VL with the highest priority will be added to the flit transmit stream. However, it is noted that this is not an absolute rule, as there may be situations under which preemption does not occur. At the same time, if FP content is only available for a given VL or multiple VLs with the same priority, that FP content will be added to the flit transmit stream regardless of the priority levels of other VLs (that currently do not have any buffered FP content). This situation is illustrated in FIG. 16, as follows.

At a time $T_1$, at least a first portion of Packet 1 is buffered in VL1 buffer 1602 and ready for transmission. Due to the streaming nature of data transfers under the architecture, flits may both be received at (added to) and removed from (for transmission) VL buffers. Moreover, adding flits to and removing flits from VL buffers may be somewhat asynchronous, particularly at a switch. As a result, at any given point in time a given VL buffer may or may not have content that is buffered and ready to transmit. In the example of FIG. 16, at time $T_1$, only VL1 buffer 1602 contains flits ready to transmit, while both VL2 buffer 1604 and VL3 buffer 1606 are empty. In order to initiate adding flits for an FP packet to the flit transmit stream, at least the Head flit or flits (depending on the particular FP format) need to be at the head of the VL FIFO buffer. (As described in further detail below, in one embodiment VL buffers are implemented as circular FIFOs, with the FIFO head identified by the FIFO head pointer.) In FIG. 16, a head flit 1610 is buffered at the head of VL1 buffer 1602 at time $T_1$.

At time $T_1$, a first group of flits 1612 is added to an LTP 2 of flit transmit stream 1608, with head flit 1610 at the beginning of the flits 1612 being added at time T2, with the time difference between T1 and T2 representing an amount of time it takes the arbiter to recognize the active VL is to be changed to VL1 buffer 1602 and time to copy flit data from the buffer to flit transmit stream 1608. The difference between $T_1$ and $T_2$ in FIG. 16 is not to scale; but rather is used to illustrate there will be some finite time between when FP data arrives at a VL buffer and is ready for transmission and when that data is actually added to the flit transmit stream.

At time T3, a first portion of Packet 2 has been received at VL2 buffer 1604, beginning with a head flit 1615. Since VL2 has a higher priority than VL1, a preemption event is detected by the arbiter (or other logic, not shown). Depending on the implementation, a preemption event may be detected very shortly after the head flit(s) for Packet 2 reaches the head of the VL2 buffer 1604 FIFO, or there may some delay to reduce the occurrence of some level of interleaving since extra interleaving may result in causing bubbles at other ports, resulting in even more interleaving. For example, if a current packet having flits added to the flit transmit stream has only a few flits left and the would-be preempting packet is large, the logic may wait for the current packet to complete such that preemption of the current packet doesn't occur. In response to the preemption event, the active VL is switched from VL1 to VL2 using the Push and Pop interleaving scheme. Optionally, the VL marker interleaving scheme could be used.

In response to the active VL being switched from VL1 to VL2, indicia for VL2 is loaded into the active VL register and VL1 is pushed onto the stack. As depicted at a time $T_4$, a first group of flits 1616 are pulled from the VL2 buffer 1604 FIFO and added to flit transmit stream 1608. This results in preemption of the transmission of Packet 1 in favor of Packet 2, as well as interleaving flits from Packet 1 and Packet 2.

At time $T_5$, a first portion of Packet 3 has been received at VL3 buffer 1604, beginning with a head flit 1618. Since VL3 has a higher priority than VL2, a second preemption event is detected by the arbiter (or other logic, not shown). This results in the transmission of Packet 2 being preempted in favor of transmitting Packet 3, which is effected by loading indicia for VL3 into the active VL register and pushing VL2 onto the stack. As depicted beginning at a time $T_6$, the entirety of the flits 1620 for Packet 3 are added to flit transmit stream 1608, thus interleaving Packet 3 flits with Packet 2 flits.

In connection with adding tail flit 1622 to flit transmit stream 1608, the arbiter (or other logic) detects that adding the flits from Packet 3 has completed. Thus, VL3 is removed from the active VL register, and VL2 is popped off of the stack into the active VL register, returning VL2 as the active VL. This results in the remaining flits 1624 of Packet 2 being added to flit transmit stream 1608, beginning at time $T_7$, and ending at time $T_8$, at which point it is detected that the tail flit 1626 has been added and thus Packet 2 has completed. This results in VL1 being popped off the stack into the active VL register, and VL1 replacing VL2 as the active VL. The remaining flits 1628 of Packet 1 are then added to flit transmit stream 1608, completing at a tail flit 1630 at a time $T_9$. A head flit for the next fabric packet is then added as the last flit for LTP7 (the next fabric packet is not shown for simplicity).

FIG. 17 illustrates a bubble interleaving event, followed by a preemption interleaving event. When the flits for a Fabric Packet traverse a routing path including multiple hops, a portion of the flits may be preempted at one or more switches. This results in a disruption of the flit stream for a given FP. When such a disrupted flit stream is received at a receive port, there is a gap between when the portion of the flits that were transmitted prior to the preemption and the portion of the flits that were transmitted after the preemption. This results in a "bubble." In addition to this bubble example, bubbles may also result for various other reasons. In response to detection of such bubbles, interleaving may be implemented with flits from FPs having the same or lower priority level as the FP with the bubble.

As in the example of FIG. 16, at time $T_1$ at least a first portion of Packet 1 including a head flit 1700 is received in VL1 FIFO buffer 1602, and beginning at a time $T_2$ a first portion of flits 1702 is added to an LTP 2 of a flit transmit stream 1704. At time T3, a first portion of flits for Packet 2 is received at VL2 FIFO buffer 1604, beginning with a head flit 1706. VL1 and VL2 both are assigned a low priority, and thus each of Packet 1 and Packet 2 are assigned the same low priority level. Although FPs and/or their flits cannot pass one another when assigned to the same virtual lane, FPs and/or their flits are permitted to pass one another when they are assigned to different virtual lanes. This situation may also result when the different virtual lanes have the same priority level. Generally, when FPs in two (or more) virtual lanes share the same priority level, the FPs are added (via their flits) to an flit transmit stream in their entirety, e.g., all flits for a first FP are added, all flits for a second FP are added, etc. The selection of which FP to send out next from multiple VLs sharing the same priority level will be a function of the arbiter selection logic, which generally will be designed to treat transmission of FPs in the VLs equally (or fairly equally). For example, in some embodiments a round-robin scheme may be implemented. Such a round-robin scheme may also consider the length of FPs, such that the buffer usage level across the multiple VLs is targeted for some level. For instance, a round-robin only approach between two VLs would alternate sending of FPs in the VLs, whereas a usage level approach may transmit a first FP from one of the VLs, followed by second and third FPs from the other VL if the first FP is significantly larger than the second and third FPs.

Under the example illustrated in FIG. 17, normally all of the flits for Packet 1 would be sent, followed by all of the flits for Packet 2 (presuming there were no preemption interleaving events and only VL1 and VL2 were being considered for arbitration). However, as illustrated, there is a bubble in the transfer of flits for Packet 1 beginning at a time $T_4$. The arbiter logic considers the existence of the bubble in combination with the availability of flits for Packet 2 in VL2 FIFO buffer 1604. In response, a bubble interleaving event is detected, which results in Packet 2 flits 1708 being interleaved with Packet 1 flits, beginning at a time $T_5$. As with preemptive interleaving, the initiation of interleaving begins by loading VL2 into the active VL register and pushing VL1 onto the stack.

While flits from Packet 2 are being added to flit transmit stream 1704, at a time $T_6$ a second (and remaining) portion of flits for Packet 1 begin to be received and buffered in VL1 FIFO buffer 1602. Although these flits are available for immediate transmission, their receipt at time $T_6$ does not create an interleaving event (or otherwise end the interleaving of flits from Packet 2). Rather, flits from Packet 2 continue to be added to flit transmit stream 1704 until a preemptive interleaving event is detected at time $T_7$ in response to detection of the availability of Packet 3 flits including a head flit 1710 in VL3 FIFO buffer 1606. As in the example of FIG. 16, VL3 has a high priority level that is also higher than the priority level for either VL1 or VL2. As a result, the availability of flits for high priority Packet 3 initiates a preemptive interleaving of Packet 3 flits 1712 with Packet 2 flits, beginning at a time $T_8$ and completing at a time $T_9$ with the addition of a tail flit 1715. At the completion of the interleaving of Packet 3, VL2 is popped off the stack and loaded into the active VL register, thus returning VL2 as the active virtual lane. This results in adding Packet 2's remaining flits 1716 to flit transmit stream 1704.

At the completion of Packet 2, as identified by a tail flit 1718 to flit transmit stream 1704 at a time $T_{10}$, VL1 is popped off the stack and loaded into the active VL register, returning VL1 as the active VL. This results in adding flits 1720 corresponding to the remaining portion of Packet 1 to flit transmit stream 1704, where the adding of flits for Packet 1 is completed when a tail flit 1722 is added at a time $T_{11}$.

Link Reliability

As discussed above, the architecture's fabric is "lossless," meaning that packets are never discarded upon reception or otherwise "lost" during transmission. This is accomplished via a combination of mechanisms that primarily include the use of credit-based flow control and the use of replay buffers. Under the credit-based approach, a sending unit (e.g., HFI, switch, or gateway) will not send flits to a receiving unit (e.g., another HFI or switch) unless the sending unit has credit for transmitting the flits; credits are on per-VL basis and are used to indicate a receiver has adequate buffer space for the VL that is to be used for the flits.

Each LTP includes one or more CRCs that are used for verifying data integrity, depending on whether standard detection or enhanced detection LTPs are used. The CRC(s) are calculated over the data content of the LTP and the resulting CRC value(s) is/are appended to the end of the LTP, following the last flit (flit 15), as illustrated in FIGS. 5-8 and described above. Upon reception, the CRC(s) are recalculated and a comparison between the CRC(s) and the received LTP and the CRC(s) in the received data is made to determine whether there are any data errors. If a transmitted CRC and a CRC calculated over the received data do no match, a data error is detected. In response to detection of a CRC mismatch, the LTP is retransmitted through use of a replay buffer.

'Reliable' LTPs are held in a replay buffer for period of time that is long enough to guarantee that a lack of a retransmit request indicates it has been received successfully by the peer. Under this approach, a receiver does not send ACKs to acknowledge a packet has been successfully received; rather, the lack of a retransmit request within a round trip time period provides an implicit acknowledgement that an LTP has been successfully transferred across a link. The use of the term 'reliable' LTPs is to distinguish LTPs that are held in the replay buffer from other LTPs that are not held in the replay buffer, such as null LTPs. Accordingly, null LTPs are not retransmitted.

Replay buffer location pointers are maintained for each LTP at the transmitter (NxtTxLTP) and receiver (NxtRxLTP) but are not exchanged as part of the LTP. When a transmission error is detected by the receiver (via a CRC mismatch) it sends a RetryReqLTP to the transmitter that contains the NxtRxLTP replay buffer location pointer. Upon receipt of the RetryReqLTP at the transmitter, the LTPs in the replay buffer are retransmitted in the original order, starting with the RetryReqLTP (peer NxtRxLTP) and ending with the last replay buffer location written. In one embodiment, a next replay buffer slot to write LTP data to (NxtWrLTP) is used, and thus the last replay buffer location written is NxtWrLTP−1.

In connection with detection of a link error indicated by a CRC mismatch, a second mechanism is implemented to determine which lane is errant. This mechanism employs a per-lane CRC that is only calculated at the receiver and does not use a comparison to a per-lane CRC in the transmitted data (as none exists). Rather, the per-lane CRC is used to compare per-lane CRCs that are calculated for an LTP with a CRC mismatch to corresponding per-lane CRCs that are recalculated for the same LTP when it is retransmitted via the replay buffer, either on a per-lane or per transfer-group basis, as discussed below.

Figure 18A:
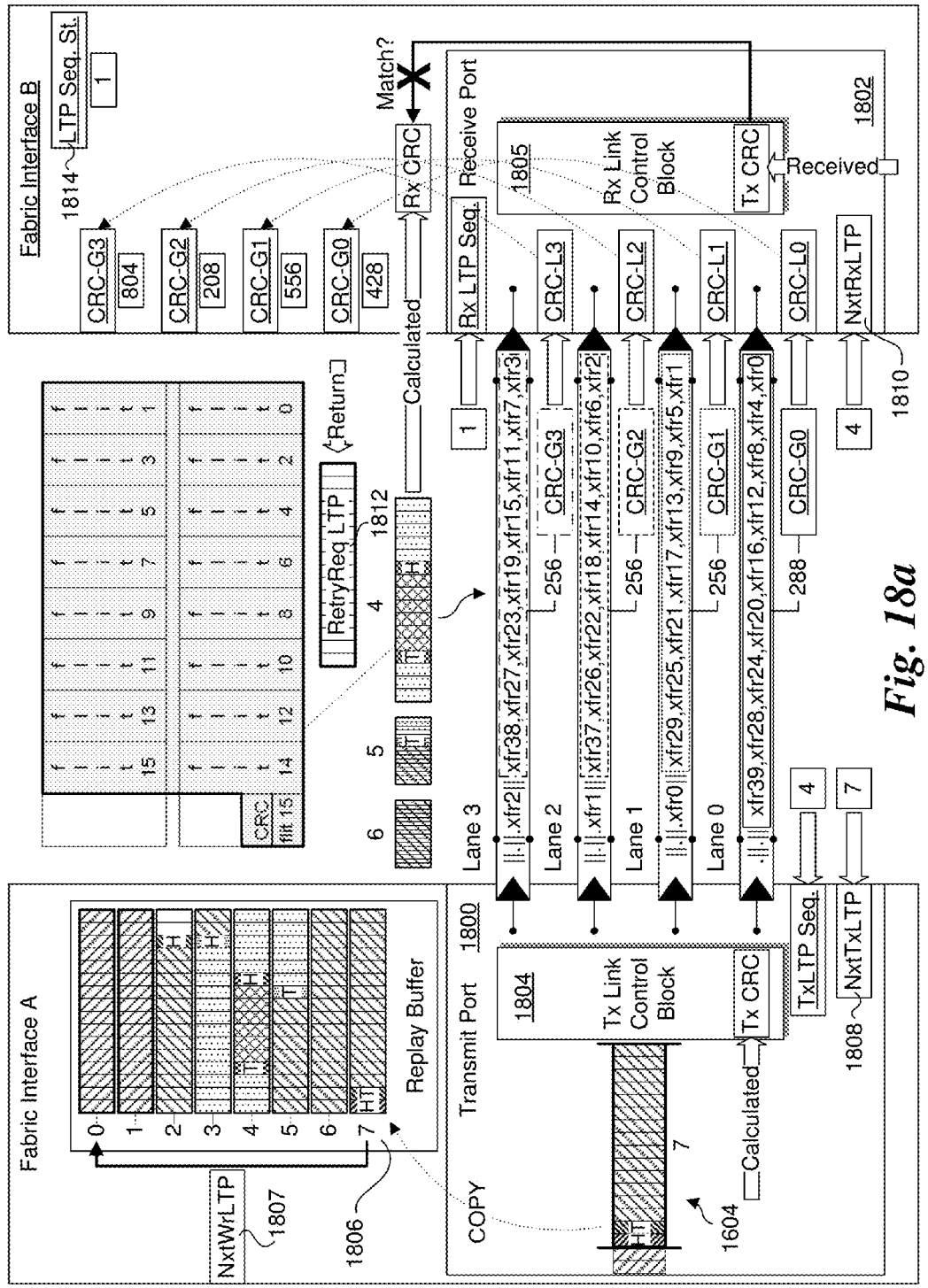
Figure 18B:
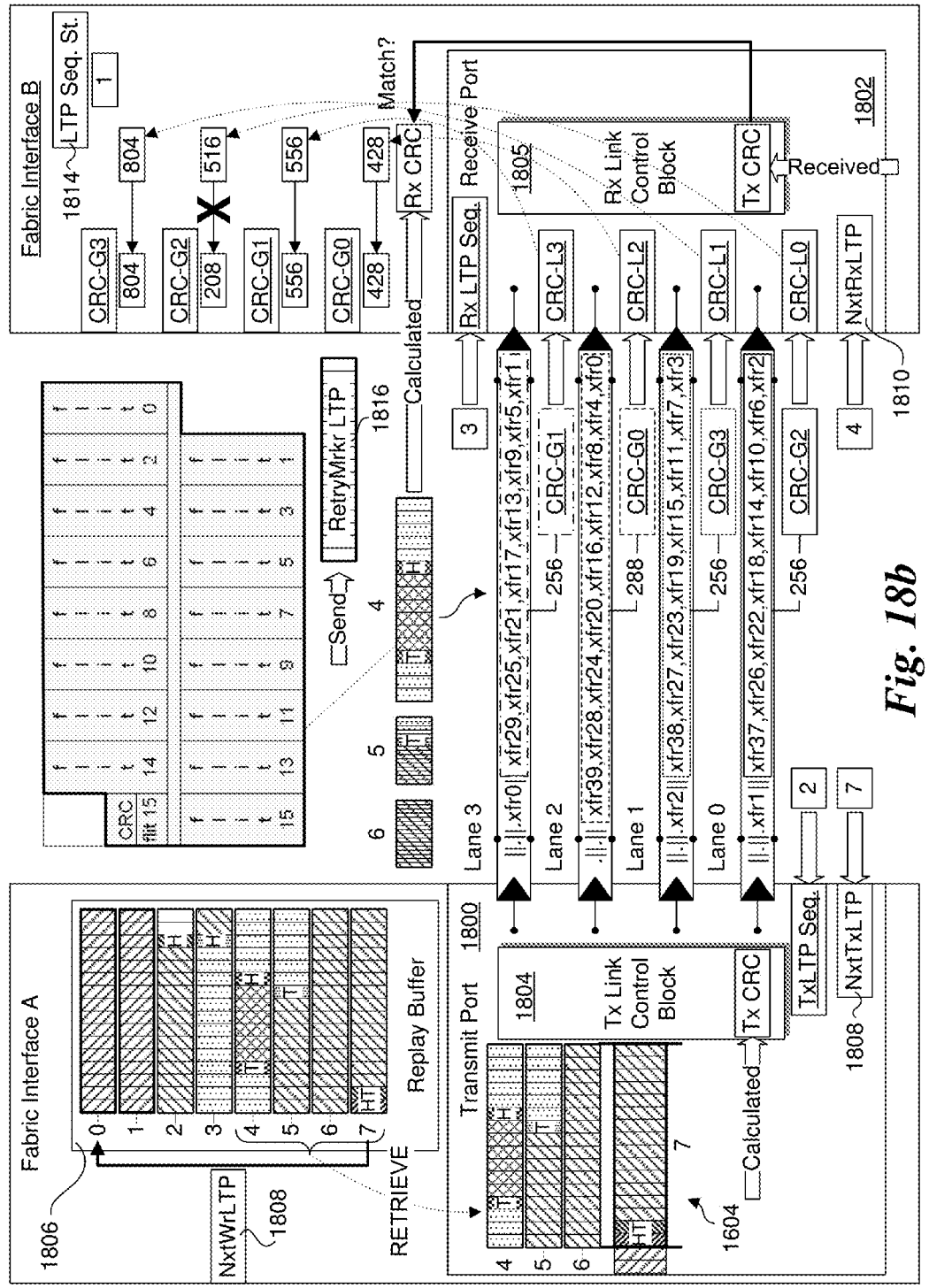

An example of usage of a replay buffer along with usage of per-lane CRCs to detect errant lanes is illustrated in FIGS. 18a and 18b. In this example, an LTP transmit stream including LTPs 2, 3, 4, 5, 6, and 7 of LTP transmit stream 1604 are being transmitted from a link interface A of a device A to a link interface B of a peer device B at the other end of the link. More specifically, the LTP transmit stream is transmitted from a transmit port 1800 of link interface A to a receive port of link interface B using a four-lane link interconnect similar to that shown in FIG. 17 discussed above. Under the architecture's links, LTP content is sent serially over multiple lanes in parallel. As discussed above, the number of lanes may vary depending on the particular link configuration; in addition, transfers on links that have a reduced number of lanes are also supported. By way of example and without limitation, a single bit is transmitted over each lane during a time period referred to as a Unit Interval (UI). In one embodiment, transfer of LTP data is segmented into a data unit referred to as a transfer unit (XFR). In one embodiment, each XFR is 32-bit quantity. In one embodiment, all bits of an XFR are transmitted using the same lane. In some embodiments, some XFRs may be transmitted over multiple lanes.

FIG. 19 illustrates a mapping of XFRs for a standard detection LTP, which has a length of 1056 bits. Each XFR is 32 bits in length and is transferred over a single lane. Accordingly, there are 33 XFRs for each LTP. FIG. 20 shows the per-lane XFR mapping for a four-lane link, according to one embodiment. Nominally, for illustrated purposes and simplicity, each flit is 64-bits. However, as illustrated in FIG. 3, each flit has an extra $65^{th}$ bit that is used in whole (for Body flits) or in part (for Head and Tail flits and control flits) to identify its flit type. During transmission, the $65^{th}$ bits are transmitted in-line, meaning, upon deserialization and reassembly of the serially-transferred bit streams transmitted in parallel over the multiple lanes, the $65^{th}$ bits are present every $65^{th}$ bit position in the 1056 bit standard detection LTP.

Figure 21:
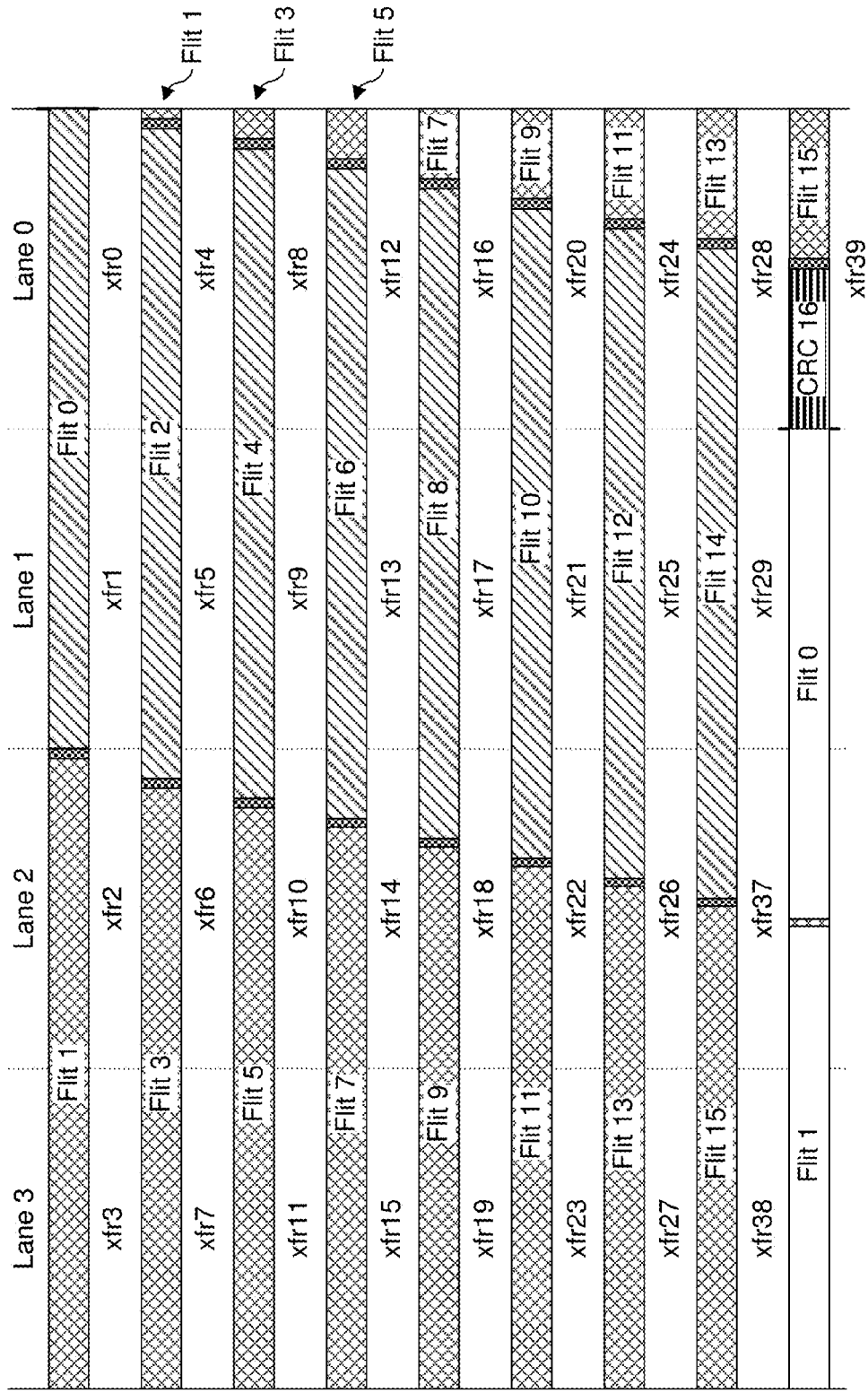
FIG. 21 is a diagram illustrating how flit data comprising 8 bytes of data plus a $65^{th}$ bit is transferred over a 4-lane link using 33 32-bit XFRs, according to one embodiment.

In one embodiment of a four-lane link, data bits for two flits are transferred over the link in parallel over 32 UI, such that 128 bits comprising four XFRs are (logically) transferred together. However, as stated above, every $65^{th}$ position is occupied by a flit type bit. As result, XFRs do not map exactly 2:1 with flits. Rather, the in-line presence of the extra $65^{th}$ bits results in a wrapped transfer, as illustrated in FIG. 21.

In further detail, in one embodiment an extra two bits are wrapped for each 128 UI, resulting in an aggregation of 16 bits after 8 groups of four-lane XFRs are completed. These 8 groups, comprise the first 32 XFRs, with the $33^{rd}$ XFR comprising the last 16 bits of flit 15 (plus its $65^{th}$ bit), followed by a 16-bit CRC (or optionally, a 14-bit CRC plus 2 control channel bits for a CRC-14 LTP). For illustrative purposes and ease of understanding, flits may be illustrated herein as being transferred in units of 64-bits; however, it will be understood that in one embodiment flits are actually transferred in units of 65-bits.

Returning to the four-lane XFR mapping of FIG. 20, the use of 33 XFRs per 1056-bit standard detection LTP results in a wrapping of one XFR for each LTP. This, in turn, shifts the starting point of each following LTP to the next lane, in accordance with an LTP starting lane sequence of Lane 0, Lane 1, Lane 2, Lane 3, return to Lane 0, Lane 1 . . . etc. This is referred to herein as a four-lane standard-detection LTP 'sequence,' or simply LTP sequence for short (as applied to the standard-detection LTP transfers over four lanes illustrated and discussed herein). For convenience, the LTP sequence states are illustrated as $1^{st}$, $2^{nd}$, $3^{rd}$, and $4^{th}$, although in one embodiment it is tracked as 0, 1, 2, 3 using two bits.

As shown in FIG. 18a, serialization and mapping of flits in LTP transmit stream 1604 is performed by a transmit link control block 1804 (or otherwise a portion of this operation is performed by another block that is not shown). Prior to being processed by transmit link control block 1804, the data content for each reliable LTP is copied into one of the LTP slots in a replay buffer 1806, wherein the slot is identified by a NxtWrLTP pointer 1807. Generally, the replay buffer may have a variable-size, or a predetermined-size. In one embodiment, the replay buffer may be selectively configured to one of multiple predetermined sizes.

As illustrated, in one embodiment, the replay buffer is implemented as a circular FIFO with a next transmit LTP (NxtTxLTP) pointer 1808 having a value that wraps from the last FIFO slot back to the first FIFO slot (wraps from slot 7 to 0 in this example). The use of a circular FIFO results in prior LTP data (corresponding to previously transmitted LTPs) being overwritten by new (next to be transmitted) LTP data; however, measures are provided to ensure that no LTP data is overwritten until an implicit acknowledgement that the LTP data has been successfully transferred is detected, as detailed below. This scheme facilitates reliable transmission of data over a link without requiring the use of explicit ACKs, thus reducing the overhead associated with use of ACKs. This also reduces the buffering at transmit ports necessary for supporting ACK-based reliable transmission schemes used for protocols above the link layer (such as TCP).

With reference to flowcharts 2200a-e of FIGS. 22a-22e and the transmitter and receiver state machine diagrams 2370 and 2350 of FIGS. 23a and 23b, handling of link errors including detection of errant link lanes is implemented in the following manner, according to one embodiment. During a link initialization process, various information is exchanged between the peer transmit and receive ports of the link's interfaces, establishing a bi-directional communication link. During this process, the replay buffer's NxtTxLTP pointer 1808 and a corresponding next receive LTP (NxtRxLTP) pointer 1810 on the receive side are initialized to 0. Upon successful link initialization, the link transfer mode is set to "normal" as depicted by a start block 2202 and the LinkTransferActive.normal states for the transmitter and receiver in FIGS. 23a and 23b, and LTPs are ready to be transferred across the link. For clarity, the following focuses on data being transferred in one direction; similar operations are performed in the reverse direction (using a separate set of lanes) to support bi-directional communication over the link.

As the LTPs in LTP transmit stream 1604 are sequentially transmitted, the LTPs' data are sequentially copied into replay buffer 1806, with NxtTxLTP pointer 1808 advancing one slot per LTP (or wrapping back to 0 once the last slot (MyLTPmax) is reached. For the illustrated example state in FIG. 18a, LTPs 2-6 have been previously transmitted from transmit port 1800, with LTPs 2 and 3 having been previously received by receive port 1802, were processed by a Rx Link Control block 1805, and were determined to be good LTPs based on LTP CRC matches. LTP 4 is about to be received, while LTPs 5 and 6 are in-flight (data for these LTPs has been sent outbound from the transmitter port 1800, but have yet to be received at receive port 1802).

Returning to flowchart 2200*a*, the main flowchart loop begins in a block 2204 in which an LTP is received at a receive port. In the example of FIG. 18*a*, this operation is depicted by LTP 4 being received at receive port 1802. As depicted in a block 2206, for each lane, a CRC is calculated based on the data received over that lane during the applicable LTP sequence state, and the CRC is written to per-lane CRC registers, as depicted by CRC lane registers CRC-L0, CRC-L1, CRC-L2, and CRC-L3. In one embodiment, the data in these registers is overwritten by the CRC calculation results for the current LTP, such that the CRC lane registers only store data for the most recently-processed LTP. In one embodiment, the per-lane CRC for a four-lane link is a 12-bit CRC that is dynamically calculated as bits for each lane are received.

In a block 2208, a CRC for the received LTP data (Rx CRC) is calculated, and compared to the Tx CRC in the transmitted LTP. The Tx CRC is calculated by transmit port 1800 using the LTP data that is to be transmitted to the receiver and is appended at the end of the LTP, as illustrated in the various LTP formats herein. The receiver extracts the TX CRC from the received LTP data and compares the Tx CRC with an Rx CRC calculated over the received LTP data. In a decision block 2210 a determination is made to whether the received Tx CRC and the calculated Rx CRC match. If they match, the LTP is deemed good, and normal processing of the LTP data is performed, as depicted in a block 2212, and the logic returns to block 2204 to process the next received LTP.

In the example shown in FIG. 18*a*, the Tx CRC and Rx CRCs do not match (CRC mismatch) for LTP 4, which indicates an LTP data error. Link data errors may result from various link conditions, and at this point the particular link condition causing the error is unknown; what is known is the LTP data that is received is different than what was transmitted, and thus the received LTP has errant data and will not be processed further. The mismatched LTP CRC corresponds to a NO result for decision block 2210, causing the logic to proceed to a block 2214 in which the LTP is depicted as being bad, as also depicted by RcvBadLTP in receiver state diagram 2350. In response to detection of a bad LTP, multiple operations are initiated and performed substantially in parallel, as depicted by the operations in each of blocks 2216 (in FIGS. 22*a*, 2218, and 2220 (in FIG. 22*b*).

As depicted in block 2216, the per-lane CRC values that were calculated for a bad LTP are stored on a per-lane or per XFR-group basis. If the number of XFRs per LTP is evenly divisible by the number of lanes, then the per-lane CRC values are stored on a per-lane basis; otherwise, they are stored on a per XFR-group basis. For example, for a link with three active lanes and 33 XFRs, per-lane CRC values are stored, since 33/3=11. Conversely, for either four or two lanes, the per-lane CRC values are stored on a per XFR-group basis (33/4=7.5 and 33/2=16.5). If per XFR-group CRCs are stored, the receive LTP sequence state is stored in a register 1814.

Figure 24:
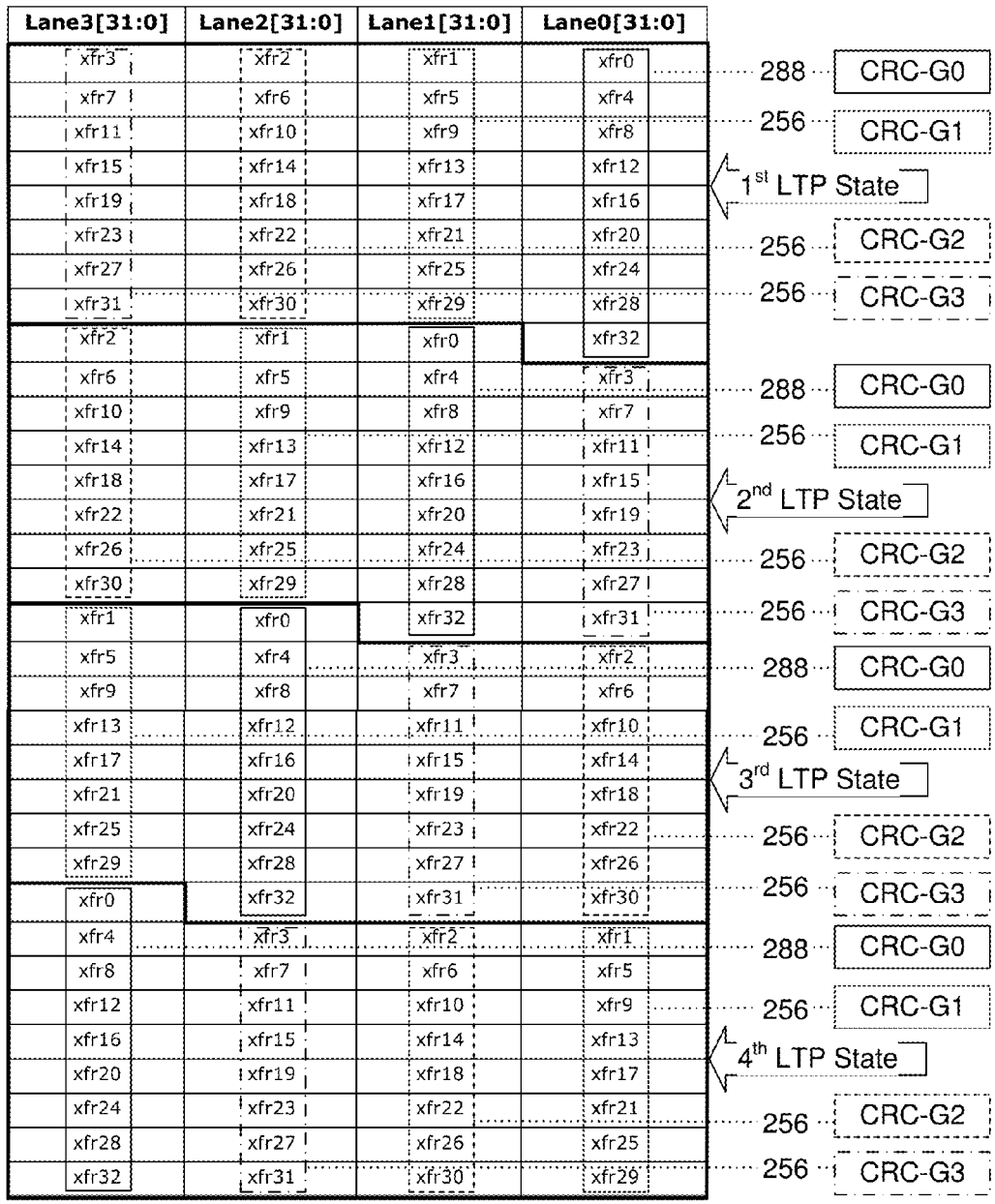
FIG. 24 is a diagram per-lane CRCs that are calculated and stored on a XFR-group basis, according to one embodiment.

An example of per XFR-group CRCs is illustrated in FIG. 24. As shown, the number of XFRs for which the per-lane CRCs are calculated is not equal across the four lanes; rather, one of the lanes will receive 9 32-bit XFRs (and thus 288 bits) per standard detection LTP, while the other three lanes will receive 8 32-bit XFRs (and thus 256 bits). Moreover, the lane receiving 9 32-bit XFRs will depend on the LTP sequence state. As will be discussed in further detail below, the stored per-lane CRCs are used to detect which lane or lanes produced the error by comparing the per XFR-group CRCs for an LTP having a CRC mismatch and a subsequent retransmission of the same LTP. Since the LTP sequence used for the original LTP transmission may be different than the LTP sequence used for the retransmitted LTP, per XFR-group CRCs are employed. The per-XRF group CRCs will result in comparing CRCs calculated over the same XFRs, whereas if a per-lane CRC scheme was used this may or may not result in the CRC calculations being over the same XFRs when operating a link with four lanes (25% chance of being the same) or two lanes (50% chance of being the same).

As shown in FIG. 24, the per XFR-group CRCs are labeled CRC-G0, CRC-G1, CRC-G2, and CRC-G3. The transfers over which these CRCs are calculated will depend on both the lane and the LTP sequence state. For example, for the first LTP sequence state, CRC-G0 is calculated from the 9 XFRs 0, 4, 8, 12, 16, 20, 24, 28, and 32 received on lane 0, while the calculated values for CRC-G1, CRC-G2, and CRC-G3 will depend on the 8 XFRs depicted for lanes 1, 2, and 3, respectively. Under the second LTP sequence state, CRC-G0 is calculated from the 9 XFRs on lane 1, while the calculated values for CRC-G1, CRC-G2, and CRC-G3 will depend on the 8 XFRs depicted for lanes 2, 3, and 1, respectively. A similar approach is used for both the $3^{rd}$ and $4^{th}$ LTP sequence states, as shown.

Figure 25:
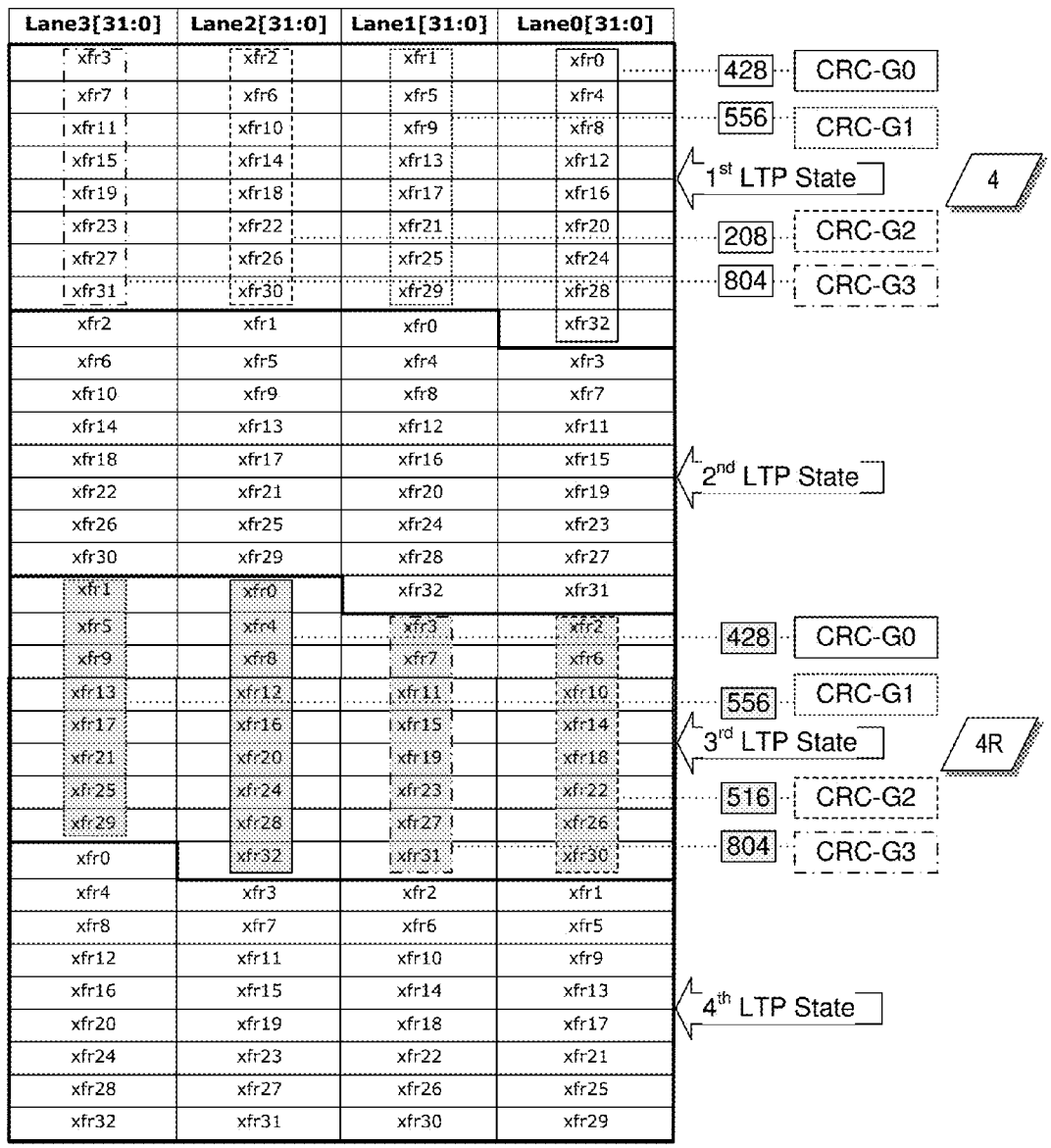
FIG. 25 is a diagram showing exemplary per-lane CRC calculations stored on a per XFR-group basis for the example of FIGS. 18a and 18b under which per-lane CRCs calculated during an original transmission of a bad LTP under a first LTP sequence state and retransmission of the bad LTP from the replay buffer under a third LTP sequence state.

During the timeframe depicted in FIG. 18*a*, the LTP sequence state is 1, and thus CRC-G0, CRC-G1, CRC-G2, and CRC-G3 are respectively calculated from data received for LTP 4 on lanes 0, 1, 2, and 3. Exemplary calculations for LTP per XFR-group CRC-G0, CRC-G1, CRC-G2, and CRC-G3 values are shown in FIGS. 18*a* and 25, and are respectively are 428, 556, 208, and 804. These per XFR-group CRC values are stored in registers CRC-G0, CRC-G1, CRC-G2, and CRC-G3.

Figure 22A:
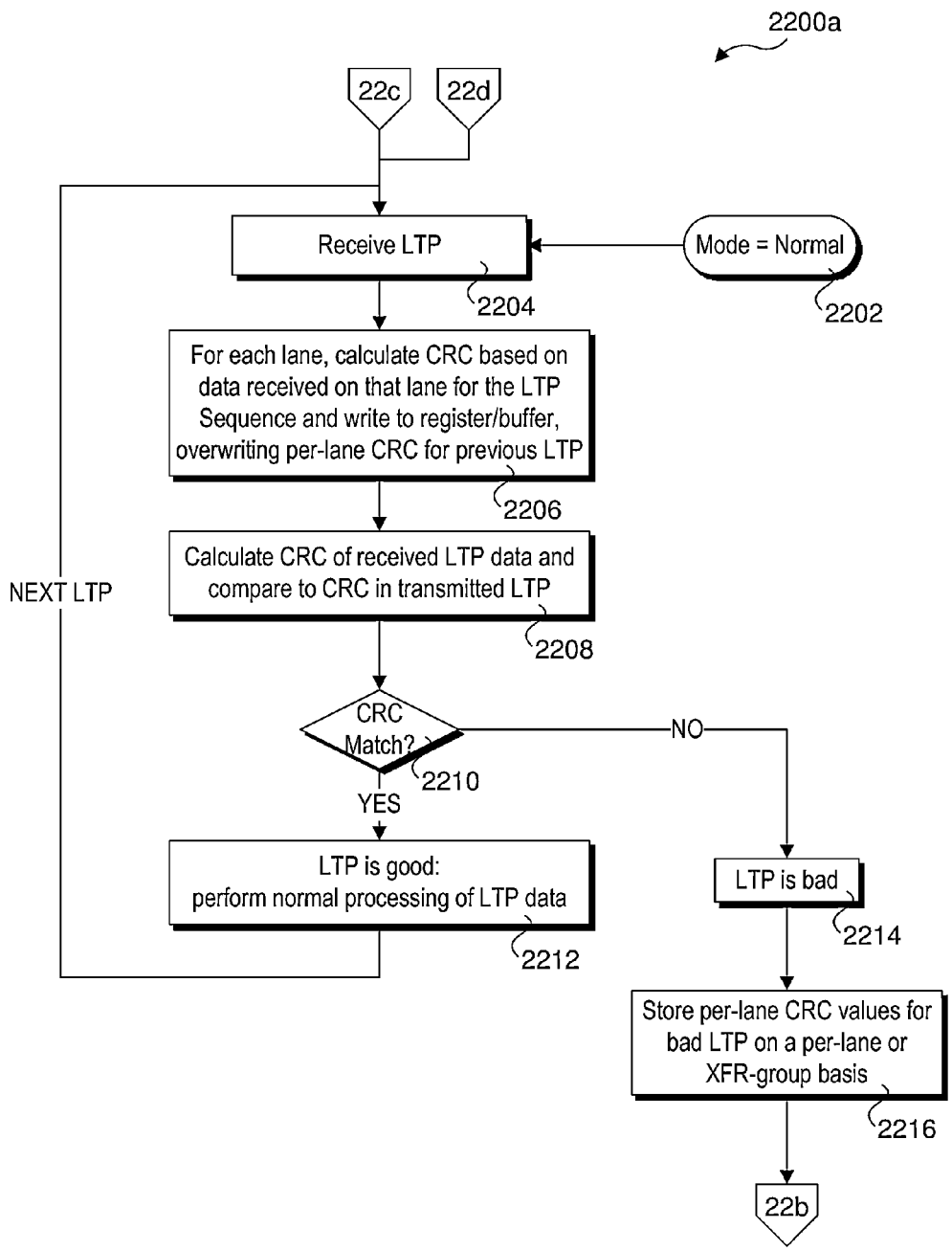
FIGS. 22a-22e collectively comprise is a multipage flowchart illustrating operations and logic for facilitating reliable LTP transmission at the link-level using implicit ACKs with a replay buffer, and also illustrating operation and logic for detecting errant lanes, according to one embodiment.
Figure 22B:
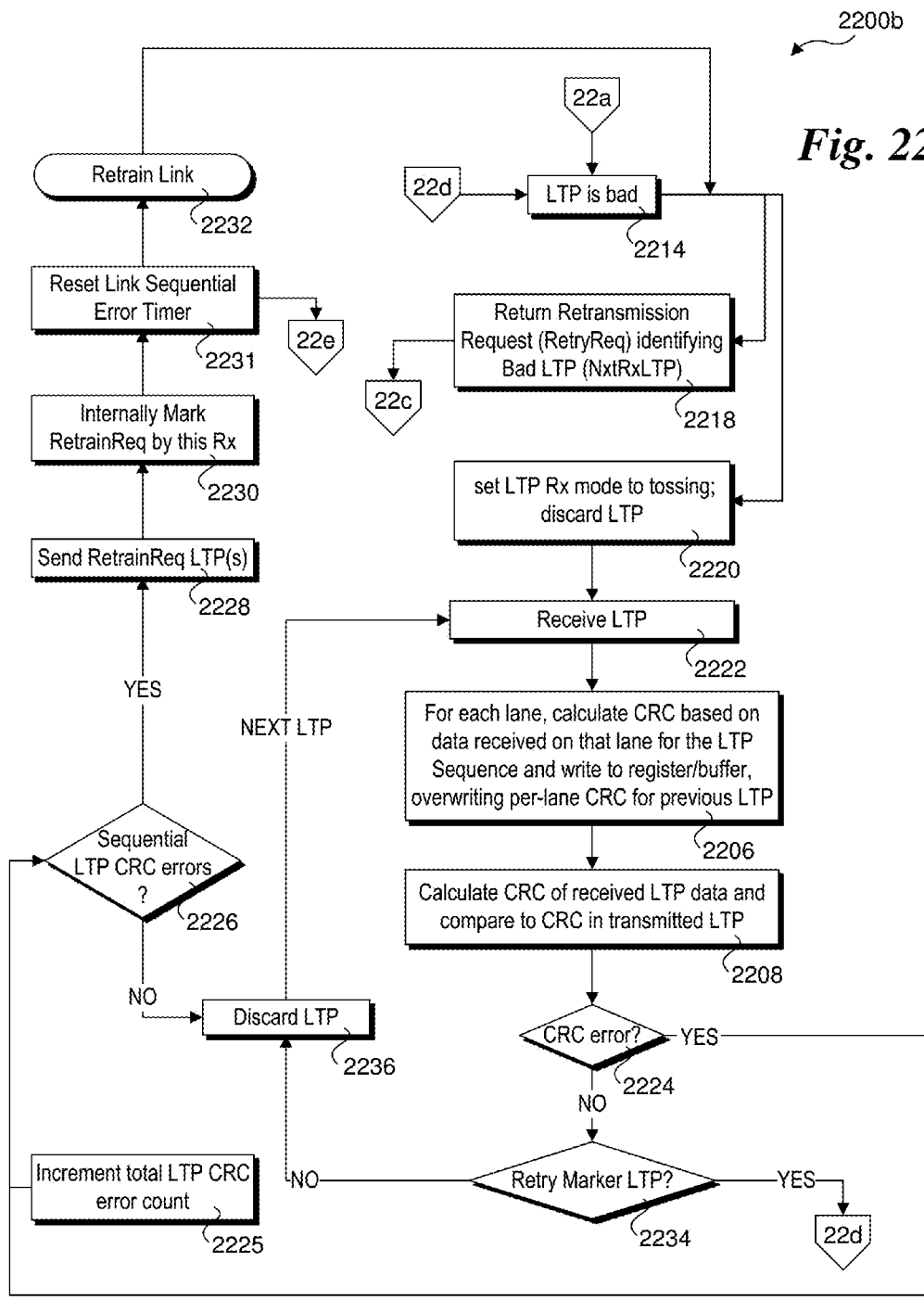
Figure 22C:
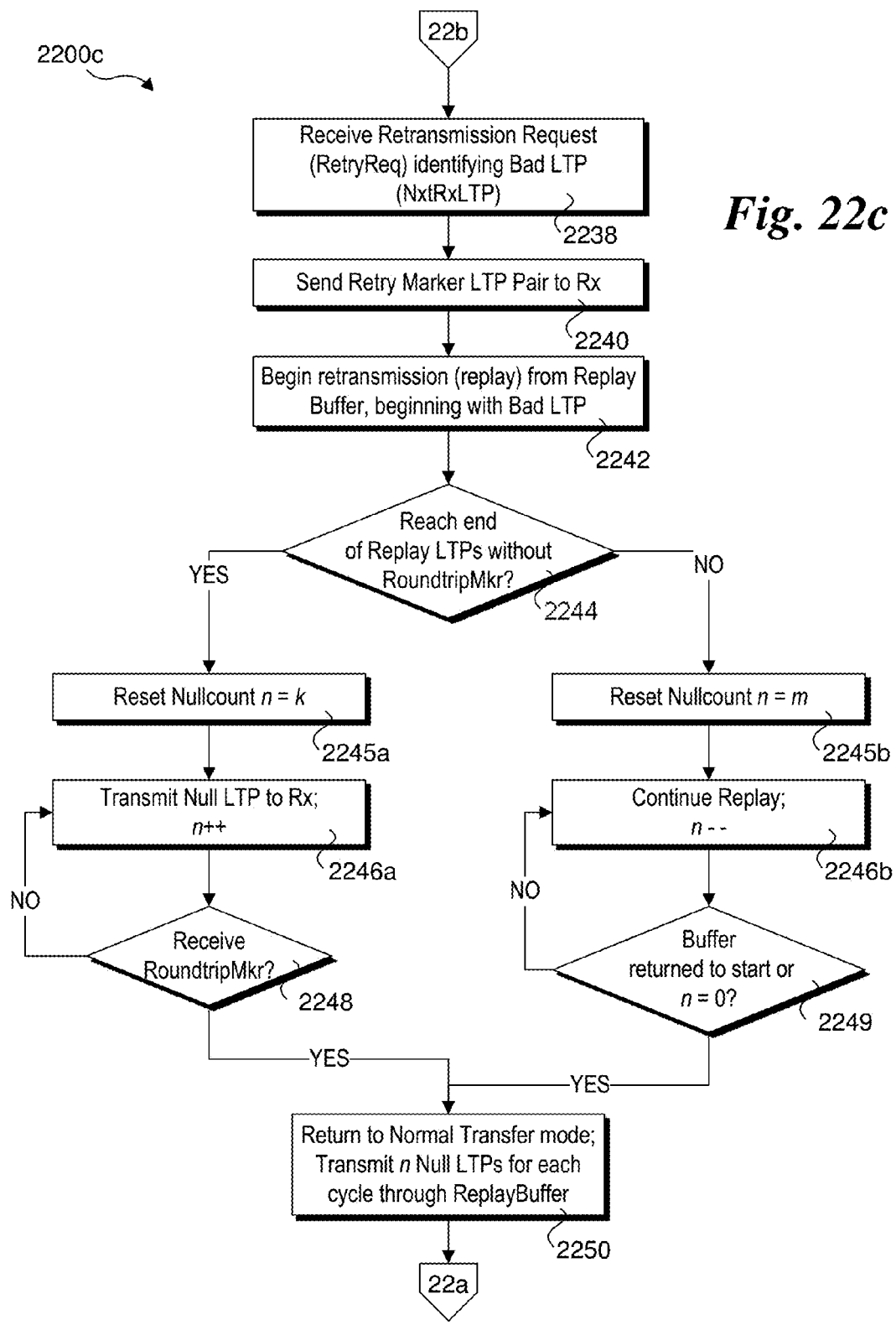

Continuing at flowchart 2200*b* in FIG. 22*b* at block 2218, a retransmit request (RetryReq LTP 1812) is returned from the receiver to the transmitter, identifying the bad LTP via the current value for NxtRxLTP pointer 1810. In one embodiment a sequential pair of RetryReq LTPs are sent, while in another embodiment a single RetrReq LTP is sent. In this example, the NxtRxLTP pointer value points to replay buffer slot 4, which stores data for LTP 4, the bad LTP. Details of the transmitter-side operations when in replay mode that are initiated in response to receiving RetryReq LTPs are shown in flowchart 2200*c* of FIG. 22*c*.

Also upon detection of a bad LTP in block 2216, the LTP receive mode is set to 'LTP-tossing' in a block 2220, resulting in received LTPs being tossed (discarded), including the bad LTP. LTP-tossing mode is depicted as an LTA.RxTossing state in receiver state diagram 2350. While the receiver is operating in LTP-tossing mode, LTPs are received, per-lane CRCs are calculated and registers updated, LTP CRC error checks are performed to detect sequential LTP CRC errors, and LTPs are discarded. These operations are performed in a loop-wise manner beginning with receiving an LTP in a block 2222. As before, the operations of blocks 2206 and 2208 are performed, followed by a determination made in a decision block 2224 to whether the received LTP has a CRC error (Tx CRC and Rx CRC mismatch). While the receiver is operating in LTP tossing mode, the logic is configured to check occurrences of sequential LTP CRC errors. For example, if the first received LTP after entering LTP-tossing mode has an error, sequential errors have occurred. The determination for detecting sequential errors is depicted by a decision block 2226, to which the logic proceeds if the answer to decision block 2224 is YES. In addition, a total LTP CRC error count in incremented in a block 2225. (It is also noted that the total LTP CRC error count is incremented in response to detection of each LTC CRC error, whether in normal mode or tossing mode).

CRCs are data integrity checks that are configured to detect errors in transmitted data units, such as packets, frames, etc. The mathematical formulation of a CRC is selected such that the CRC will detect bit transmission errors, and also takes advantage of the binary nature of digital data, enabling CRCs to be quickly calculated over binary quantities. However, CRCs are not 100% failsafe. The CRC check can fail to detect errors when the number of bit errors equals or exceeds the Hamming distance of the CRC. The Hamming distance of CRCs used in network fabrics is typically 4, meaning it takes at least 4 bit errors to open up the possibility (extremely low probability) that the errors would go undetected. Undetected link errors result in what is referred to as "false packet acceptance," meaning a packet with errors passes the CRC check (falsely), and is thus accepted for further processing. These undetected errors result in packet silent data corruption.

LTPs are approximately 1000 bits in size. At a given average bit error rate (BER) the probability of a missed detection is higher if the errors are correlated and occur in bursts (of 4 or greater) within a single link transfer packet vs. error patterns that are uniform where the errors are distributed in time across multiple LTPs.

Network fabric links are designed to provide a very low, but non-zero, BER. The desire to reduce link power provides motivation to allow higher BER, which tends to increase as power is reduced. As the BER increases the probability of a missed error detection increases. At some point this probability becomes unacceptably high. The BER across the many links within a fabric are non-uniform. The links are typically composed of multiple lanes and the BER can vary widely across the lanes within a given link. Under a conventional approach, when the fabric management software detects a link running at some threshold BER it is forced to remove the link from the fabric to avoid the unacceptably high probability of data corruption. This is done without knowledge of the error distribution within the link and forces the use of a conservative smaller BER threshold that assumes the errors are correlated. In addition, the BER of links may drift and/or degrade over time and become unacceptably high. The fabric manager can't monitor all links continuously in real-time all the time; as a result it may take some time to detect a link is operating at too high a BER. During this time the fabric is exposed to the potential for data corruption.

One check for closely-spaced bit errors is through use of the LTP CRC error check in decision block 2224 and the sequential LTP CRC error check in decision block 2226. While CRCs can be used to identify at least one error is detected, they don't identify how many errors are present. However, sequential LTP CRC errors indicate at least two errors are present in sequential LTPs. In one embodiment, in response to detection of sequential LTP CRC errors a pair of RetrainReq LTPs are sent to the transmitter in a block 2228 resulting in the flowchart logic exiting to retrain the link, as depicted by an exit block 2232 and RcvRetrainReq in transmitter state machine 2300. In one embodiment this retraining is a lightweight retrain that is less complex than the link (re)training operations employed when initializing or reinitializing a link. During training or reinitialization the link's normal active transfer state is offline, meaning that normal data transfer operations are temporarily unavailable until the link returns to is normal active transfer state upon completion of link training or link reinitialization. In addition, the receiver sets some internal indicia to indicate it sent the RetrainReq LTPs in a block 2230, and a link sequential error timer is reset in a block 2231, with further details of the link sequential error timer usage shown in FIG. 22e and discussed below. Upon completion of the training sequence, the logic returns to flowchart 2200b at blocks 2218 and 2220, wherein (a) retry request LTP(s) is/are sent back to the transmit side and the LTP-tossing mode is re-entered at the receiver.

The LTP-tossing mode loop is exited in response to receiving a retry marker LTP, and, accordingly, if the received LTP does not have a CRC error, the logic proceeds to a decision block 2234 in which a determination is made to whether each received good LTP while in LTP-tossing mode is a retry marker. Prior to receiving the retransmit request, the transmitter will continue transmitting LTPs in sequence, and these LTPs will be received along with the LTPs that are already in-flight (if any). As shown in blocks 2238, 2240, and 2242 in flowchart 2200c of FIG. 22c, upon receipt of the retransmit request (RetryReq LTP), the transmitter will send out a retry marker, followed by retransmission of LTPs in replay buffer 1806, beginning with the LTP in the slot indicated by the NxtRxLTP pointer value returned via the retransmit request. In one embodiment, a single retry marker is sent, while in another embodiment a pair of retry markers are sent sequentially. In one embodiment, the pair of retry markers are identified by the order they are sent (e.g., RetryMrkr0, RetryMrkr1). In one embodiment, each of the retry markers comprise null LTPs. An example of the use of a single retry marker, depicted by a RetryMrkrLTP 1816, is shown in FIG. 18b. It will be understood that when a pair of retry markers are sent, a second retry marker (RetryMrkr1) would immediately follow RetryMrkrLTP 1816 (RetryMrkr0).

In the example of FIG. 18a, this continuation of transmitting LTPs before receipt of the retransmit request results in receiving, in order, LTPs 5 and 6 (in flight), 7 (next transmitted), and LTPs 0 and 1. Since each of LTPs 5, 6, 7, 0 and 1 are not retry markers, the answer to decision block 2234 is NO for each, and the logic proceeds to discard the LTP in a block 2236 and then loop back to block 2222 to receive the next LTP, while remaining in LTP tossing mode. Processing of subsequently-received LTPs continues in the same manner until a retry marker LTP is received and detected in decision block 2234.

FIG. 18b depicts a timeframe at which a RetryMrkrLTP 1816 has been transmitted, received, and processed by receive port 1802, LTP 4 has been retransmitted and is being received by receive port 1802, followed by retransmitted LTPs 5 and 6 (in flight), with LTP 7 about to be retransmitted. Each of LTPs 4, 5, and 6 comprise "replayed" LTPs. As also shown in FIG. 18b, the replay buffer data in slots 0 and 1 (shown in FIG. 18a) is overwritten with corresponding flit data for LTPs 0 and 1 in connection with their original transmission, which occurred prior to receiving RetryReqLTP 1812 and transmitting RetryMrkrLTP 1816.

As before, for each reliable LTP transmission the LTP's data is copied into a slot in replay buffer 1806 as identified by NxtTxLTP pointer 1808, which is incremented for each reliable LTP. Thus, NxtTxLTP pointer 1808 will have been incremented in connection with sending each of LTPs 7, 0, and 1 (noting the NxtTxLTP pointer wraps from 7 back to 0). While LTP 1 is being transmitted (or shortly before), transmit port 1800 has received RetryReqLTP 1812. In response, transmit port 1800 returns RetryMrkrLTP 1816 (or a pair of retry markers comprising a RetryMrkr0 LTP followed by a RetryMrkr1 LTP). Since RetryMrkrLTP 1816 is a null LTP, its data content is not copied to replay buffer 1806, nor is NxtTxLTP pointer 1808 advanced. Conversely, the Tx LTP sequence state is advanced for each transmitted LTP, regardless of whether it is a reliable LTP or a null LTP.

Figure 22D:
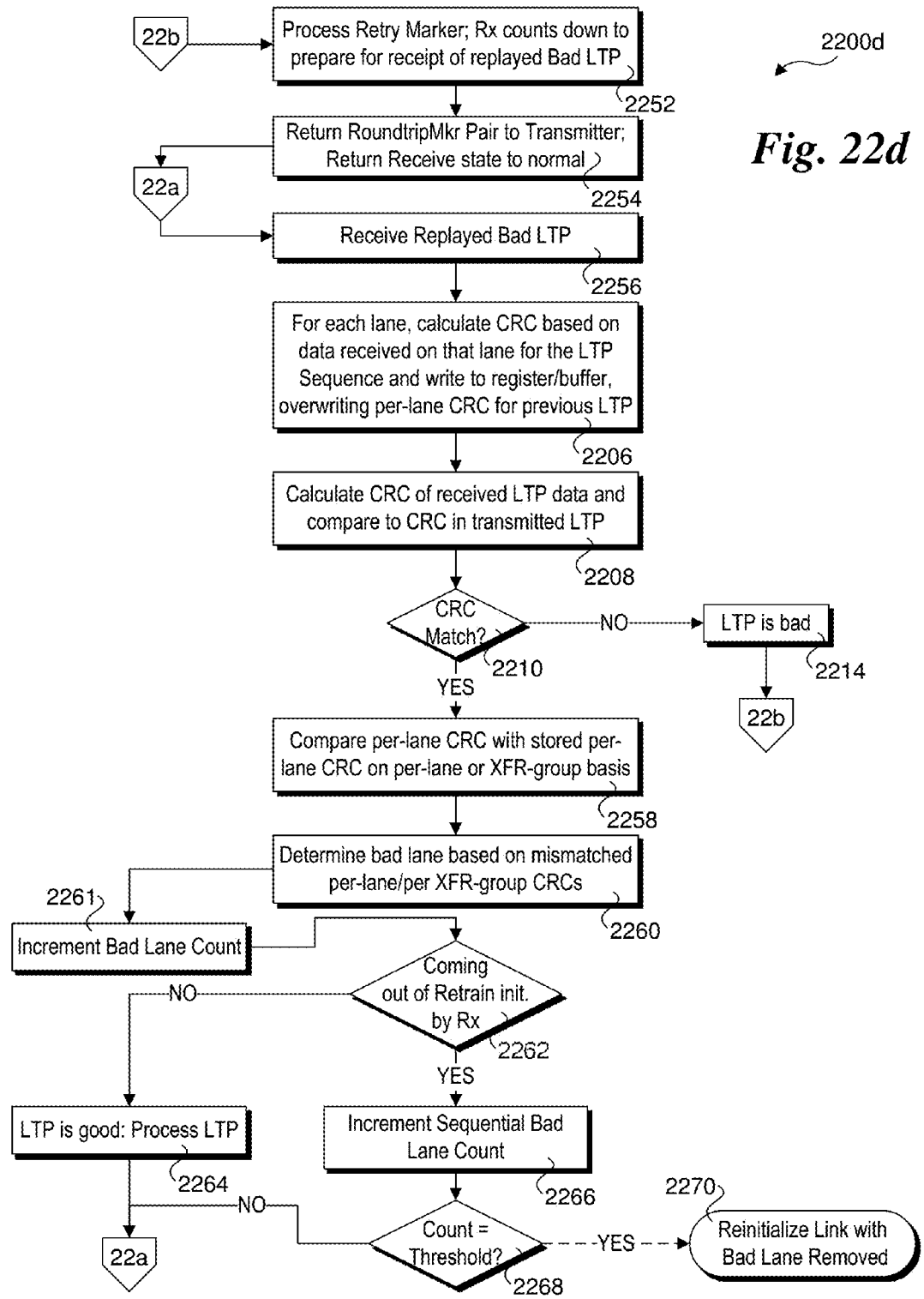
Figure 22E:
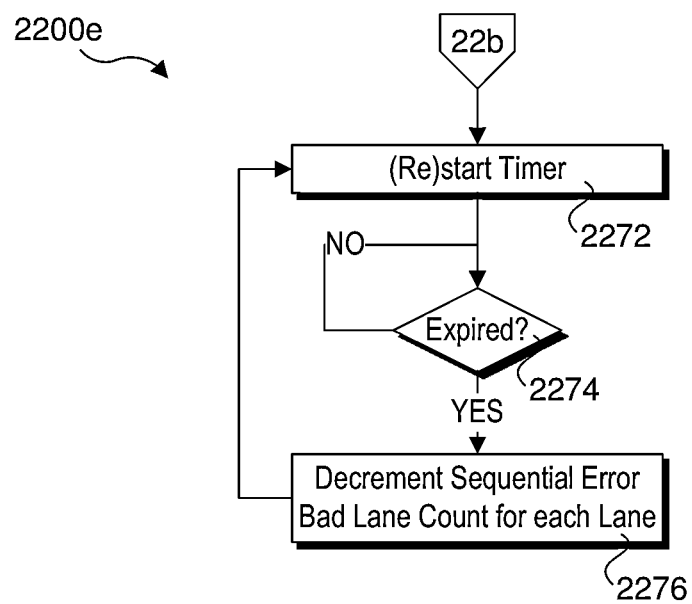

Returning to decision block 2234, upon receipt of RetryMrkrLTP 1816 it is identified as a retry marker, and the flowchart logic proceeds to flowchart 2200d in FIG. 22d. As shown in a block 2252, the retry marker is processed, and the receiver sets a countdown value to prepare for receipt of a forthcoming replayed bad LTP. In one embodiment, a bad LTP replay offset is employed relative to the retry marker, so as to indicate a retransmission of the bad LTP will commence k LTPs after the retry marker. In one embodiment employing a pair of retry markers, the bad LTP replay offset is one less for the second retry marker. As also depicted in block 2240, in view of the bad LTP replay offset, the receiver initiates a bad LTP replay countdown based on the LTP offset. This is used to detect a replay of a bad LTP in a block 2256. In addition, the receiver returns a roundtrip marker LTP in a block 2254 (or a pair of roundtrip marker LTPs) and the LTP receive mode (receive state) is returned to normal in a block 2254, with the flowchart logic returning to block 2204 to receive the next packet. This is depicted by the Send RndTripMrkr Pair state and return to the LinkTransferActive.normal state in receiver state diagram 2350. As described below with reference to FIG. 18c, the roundtrip marker LTP(s) is/are returned in response to the retry marker LTP(s) to facilitate determination to whether replay buffer LTPs can be overwritten.

Following transmission of RetryMrkrLTP 1816 (or RetryMrkr0LTP and RetryMrkr1LTP), replay (retransmission) of LTPs is initiated, beginning with retransmission of the bad LTP identified by the NxtRxLTP pointer returned in RetryReqLTP 1812 (LTP 4 in this example). While the transmitter is in replay mode, the transmitted data will comprise a retransmission of LTPs stored in replay buffer 1806. The retransmitted LTPs are sent out sequentially from transmit port 1800 based on their order in the replay buffer's FIFO and beginning with the LTP pointed to by the NxtRxLTP pointer.

For each retransmitted LTP, the transmitted data is the same as when the LTP was originally transmitted. Outside of the bad LTP replay countdown (and operations associated with receiving a replayed bad LTP), the receive-side logic is agnostic to whether received LTP data corresponds to an originally-transmitted LTP or a retransmitted LTP. Accordingly, the operations of blocks 2204, 2206, and 2208 and decision block 2210 are performed, resulting in per-lane CRC calculations, calculation of an Rx LTP CRC over the received LTP data, and comparing the Rx LTP CRC to the Tx LTP CRC. If there is an error, as indicated by a NO result in decision block 2210, the logic returns to block 2214, with the errant retransmitted LTP initiating a new replay sequence under which the bad LTP will again be retransmitted. This will essentially repeat the operations discussed above in connection with retransmission of bad LTP 4 and its following LTPs from replay buffer 1806.

Presuming the retransmitted bad LTP 4 is good, the logic flows to a block 2258. In this block the per-lane CRC values that were previously stored in registers CRC-G0, CRC-G1, CRC-G2, and CRC-G3 are compared to per-lane CRCs calculated for data received over each lane for the retransmitted LTP 4, with the comparison made on a per-lane or per XFR-group basis, depending on the number of operating lanes (noting that per-lane and per XFR-group comparisons are equivalent when the number of transfer groups are the same, such that a per XFR-group comparison could always be performed) From above, per-lane CRCs are compared on a per XFR-group basis for a four-lane link.

In connection with continued incrementing of the Tx LTP and Rx LTP sequence states for each transmitted LTP, when LTP 4 is retransmitted the LTP sequence state is 3, as compared with an LTP sequence state of 1 when LTP was originally transmitted. As a result, the XFR group transmitted across each lane has changed. This remapping of lane-XFR groups is illustrated in FIG. 25, and can also be seen by comparing the XFRs sent over each lane in FIGS. 18a and 18b. As discussed above, when LTP 4 was originally transmitted, the LTP sequence state was 1, while when LTP 4 is retransmitted (depicted by 4R in FIG. 25) the LTP sequence state is 3.

Returning to FIG. 18b, the per-lane CRCs for retransmitted LTP 4 are calculated for lanes 0, 1, 2, and 3, and then a per XFR-group CRC comparison is performed in block 2258 of flowchart 2200d, and the bad lane is identified in a block 2260 by identifying the mismatched per-lane or per XFR-group CRCs, as applicable. In the example of FIGS. 18a and 18b, the result of the per XFR-group CRC comparison indicates the CRCs for CRC-G0, CRC-G1 and CRC-G3 match, while the CRCs for CRC-G1 do not match. This indicates that lane 2 is errant, since lane 2 corresponded to the XFR group over which the CRC-G1 value was calculated for the errant LTP 4 when it was originally transmitted, noting that since there was no LTP CRC error detected in retransmitted LTP 4 there also is (presumably) no error in the data transmitted over lane 2 for the replayed LTP 4. In a block 2261 the error count for the bad lane that is identified is incremented.

Consider a scenario where a lane is intermittently errant. As discussed above, the sequential LTP CRC error check of decision block 2226 and associated logic blocks is one mechanism for detecting closely-spaced errors in data transmitted over the link. While this mechanism detects very-closely spaced errors (requiring errors in sequential LTPs), it cannot identify which lane is errant, nor how frequent sequential errors on individual lanes are occurring.

According to embodiments of a second BER check mechanism, a per-lane error frequency is monitored to determine whether the error frequency (BER) for a given lane exceeds a per-lane BER threshold. In one embodiment, this is accomplished through the use of per-lane sequential error counters and a timer (in connection with other operations and logic depicted in flowcharts 2200d and 2200e and performed in a parallel manner).

In a decision block 2262 a determination is made to whether the receiver state is coming out of a link retraining state initiated by the receiver. As shown by the logic in flowchart 2200b and described above, detection of sequential LTP CRC errors will result in link retraining initiated by the receiver detecting the errors. Conversely, while a single LTP CRC error will likewise initiate a retry request, retry marker receipt sequence, it will not result in initiating of link retraining. If the replayed LTP is good and the receive state is not coming out of link retraining (that is, only a single LTP CRC error has been detected), the answer to decision block 2262 is NO, causing the logic to flow to a block 2264 in which the LTP is processed as if it was an originally-sent LTP. The logic then returns to flowchart 2200a to process the subsequently replayed LTPs as (from the perspective of the receiver) they are being originally sent.

Now presume that two sequential LTP CRC errors were detected by the receiver, resulting in link retraining initiated by the receiver and the answer to decision block 2262 is YES, resulting in the logic proceeding to a block 2266. In this block, the sequential error counter for the bad lane that was determined in block 2260 is incremented. In a decision block 2268 a determination is made to whether the sequential error count for the lane has reached a threshold. In general, the threshold will be an integer number, such as 1, 2, etc. In one embodiment, the threshold is 2, such that 2 sequential errors on one lane within one timer period causes the lane BER threshold detection to be tripped. In response, in one embodiment the logic proceeds to an exit block 2270 under which the link is reinitialized with the lane detected as being bad removed. As a result, the number of active lanes for a link will be reduced by one lane, such as a four-lane link being degraded to three active lanes.

If the per-lane sequential error count has not reached the threshold, the answer to decision block 2268 is NO, and the logic proceeds to block 2204 to receive the next LTP with the receiver operating in its normal receive state and the transmitter still operating in replay mode.

As discussed above, in one embodiment a timer scheme is used to detect the frequency of per-lane sequential errors. From above, the logic proceeds to block 2231 in response to detection of sequential bad LTPs, and a set of parallel operations for implementing the timer scheme are initiated, as shown in flowchart 2200e of FIG. 22e. In a block 2272 a timer is started (the first time) or restarted (reset), as applicable. As depicted by a decision block 2274 and the loop back to itself, the timer is periodically checked to determine whether it has expired, or optionally the timer logic can be configured to generate an interrupt or other indicia to indicate it has expired. At the expiration of the timer the bad sequential error counter for each lane is decremented, as depicted in a block 2276. In one embodiment, the minimum bad error count is 0, so for a lane error count that is already 0, its count is not decremented.

The combination of the parallel processes detects that errors on an individual lane have exceeded a frequency threshold (e.g., identifies lanes exhibiting closely-spaced errors) in the following manner. Each time the flowchart operations results in the logic flowing through blocks 2258, 2260, and the result of decision block 2264 is YES, the sequential error count for a bad lane will be incremented. Meanwhile, in consideration of the parallel timer operations, each time the timer expires without being restarted indicates that the timer's time period has passed without a per-lane error, thus the per-lane sequential error count for each lane is decremented by one (to a minimum of zero). In one embodiment, two strikes and the lane is out, which corresponds to a lane having two sequential errors within the timer period.

In addition to a single timer, multiple timers may be used in parallel with different time periods and different associated count thresholds. For example, this would enable a longer-term view of per-lane operation to be observed, while also facilitating shorter per-lane BER threshold detection. The threshold of the number of sequential errors required in the time period may also be changed.

Under the embodiment depicted in flowcharts 2200a-e, reinitialization of a link in combination with removal of a bad lane results from detection of a lane exhibiting close-spaced errors. However, this is not meant to be limiting, as a lane may be removed in connection with reinitialization of and/or retraining a link under other conditions, such as when exiting via exit block 2232 following detection of sequential LTP CRC errors. For example, when the link is reinitialized the per lane error counters are checked to see if an error count has exceeded some threshold. If it has, that lane is marked bad and is not active when the link is returns to active operation.

Another aspect of reliable LTP transmission with implicit ACKs is a mechanism to ensure that an LTP in the replay buffer is not overwritten prior to an implicit confirmation that it has been received without errors. In one embodiment this is facilitated through the use of retry requests and roundtrip markers. As discussed above, in some embodiments the reply buffer has a fixed size or can be configured to be set to operate using one of multiple fixed sizes. In addition, a pair of link peers may employ replay buffers of different sizes.

Under use of a fixed-size replay buffer, the replay buffer will generally be sized to hold a number of LTPs that is greater than the number of LTPs that could be transferred during a roundtrip traversal of the link, with additional consideration for various processing latencies. This is the case illustrated in FIGS. 18a and 18b, wherein the replay buffer has 8 slots, and the number of LTPs that could concurrently be traversing a roundtrip over the link and the link path in the opposite direction is approximately 6 or 7 LTPs. As a result, if there is an error detected at the receiver, the transmitter will receive a retry request before the copy of the bad LTP in the replay buffer will be overwritten.

However, for practical reasons, fixed-size replay buffers are not sized to handle all possibly link lengths. The greater the length of a link, the greater the number of LTPs that could be sent out from the replay buffer prior to receiving a retry request. At some point, the link length will be such that use of the retry request scheme alone will not ensure that a copy of a bad LTP in the replay buffer is not overwritten prior to receiving a retry request for that bad LTP.

This is where use of the roundtrip marker fits in. Returning to flowchart 2200c at a decision block 2244, a determination if made to whether the replay of all of the LTPs has completed without receiving a roundtrip marker. Under the configuration illustrated in FIG. 18c, there again are 8 FIFO slots in replay buffer 1806, but the link length is such that 5 LTPs can be "on the wire" at one time, meaning that at least 10 LTPs could be in roundtrip transit and/or being processed at the receiver. As a result, all of the LTP copies in the replay buffer could be retransmitted prior to receiving a retry request for any of the LTPs, resulting in a copy of a potentially bad LTP being overwritten. This would prevent the bad LTP from being retransmitted, defeating the purpose of the replay buffer.

To accommodate this scenario, the transmitter includes logic to detect whether it has reached the end of the replay LTPs prior to receiving a roundtrip marker, as shown in decision block 2244. In essence, this determines whether the depth of the replay buffer is less than or greater than the roundtrip duration. Reaching the end of the replay LTPs is detected by the replay pointer wrapping back to the start (FIFO slot) of the first replayed LTP.

Figure 18C:
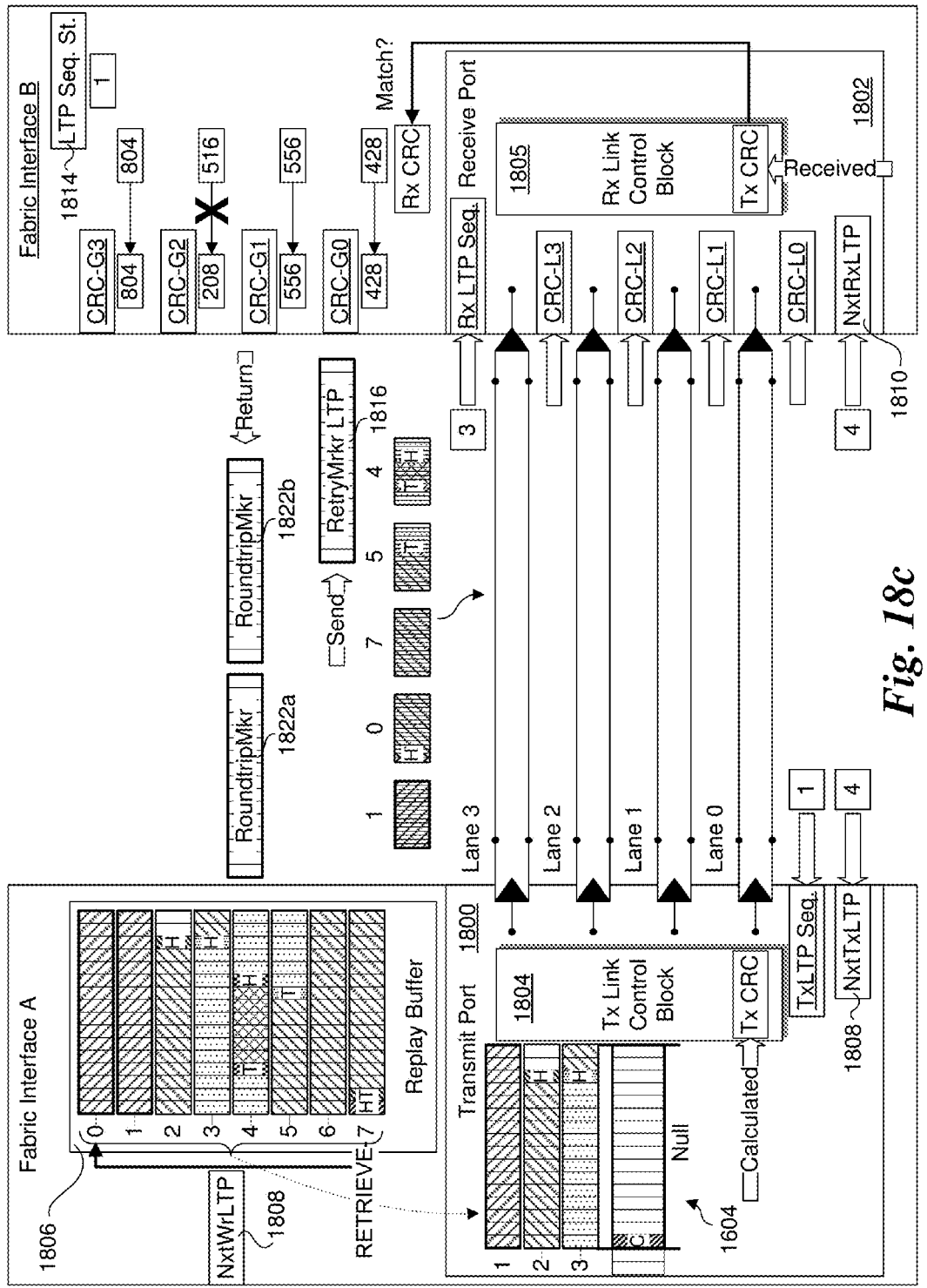
FIG. 18c is a schematic diagram illustrating use of retry markers and roundtrip markers to prevent replay buffer LTPs from being overwritten, according to one embodiment.

In FIG. 18c, the first replayed LTP slot is slot 4, and the LTPs in slots 4, 5, 6, 7, 0, 1, 2, and 3 have been sequentially retransmitted, returning the replay LTP pointer to slot 4 prior to receiving the first roundtrip marker of a pair of roundtrip markers 1822a and 1822b. This illustrates in example under which the end of the replay LTPs is reached prior to receiving a roundtrip marker, indicating that the roundtrip duration is greater than the depth of the replay buffer. This results in the answer to decision block 2244 being YES, and the logic proceeds to a block 2245a in which a Null counter (Nullcount) n for the transmitter is reset to an integer k. As depicted by a block 2246a and a decision block 2248 with a NO result looping back to block 2246a, the transmitter then proceeds to send one or more Null LTPs to the receiver until a roundtrip marker or retry request is received. In addition, for each transmitted Null LTP, Nullcount n is incremented by 1. As discussed above, a Null LTP is not a reliable LTP, and thus a copy of a transmitted LTP is not added to the replay buffer. As a result, the copy of the bad LTP that resulted in the retry request will be guaranteed to not be overwritten prior to receiving a retry request.

Figure 23A:
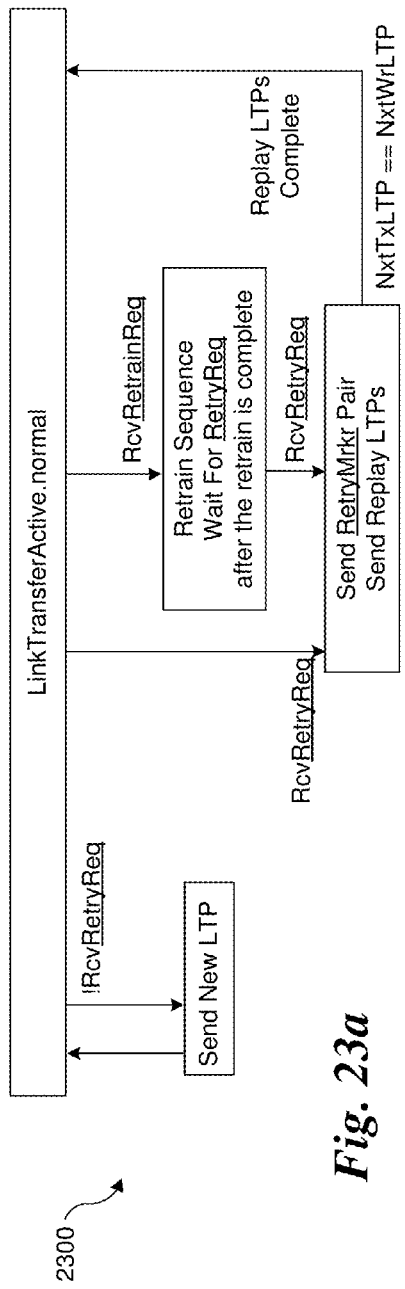
FIG. 23a is a state diagram for a transmitter, according to one embodiment.
Figure 23B:
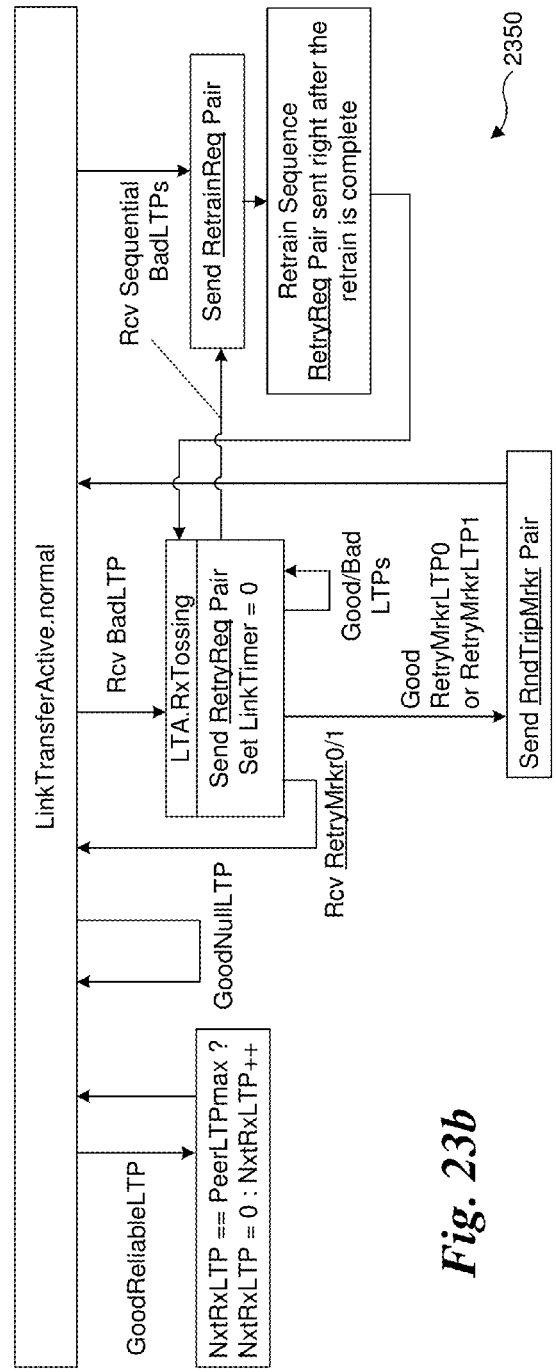
FIG. 23b is a state diagram for a receiver, according to one embodiment.

Once reception of a roundtrip marker is determined in decision block 2248a, the logic proceeds to a block 2250 in which the transmitter is returned to normal transfer mode, as also depicted by a return to LinkTransferActive.normal in the transmitter state machine 2300 of FIG. 23a, while using Nullcount n value for each cycle through the replay buffer to determine how many Null LTPs to send once the end of the replay buffer is reached. For example, let's say Nullcount n reached 4. As a result, every time the replay buffer FIFO slot reached slot 7, the transmitter would send out 4 Null LTPs. Under one embodiment retry requests and roundtrip markers have the highest priority and are never preempted, and thus the use of transmitting a number of Null LTPs defined by Nullcount n will ensure a copy of a bad LTP will not be overwritten prior to receiving a retry request for that bad LTP. As an option, Nullcount n can be reset to a value k>0 in block 2245 to provide a safety margin, such that k extra Null LTPs will be transmitted at the end of each cycle through the replay buffer. An inherent advantage of the Nullcount scheme is that it can be implemented to support a link of substantially any length (recognizing there is a practical limit to the length of a physical link, and that manufacture and/or implementation of a link having a length beyond this limit would either not be possible or realistic).

Returning to decision block 2224, if a roundtrip marker has been received prior to reaching the first FIFO slot, the answer to decision block 2244 is NO, and the logic proceeds to a block 2245b in which Nullcount n is reset to an integer m. As depicted by a block 2246b and a decision block 2249 with a NO result looping back to block 2246b, the transmitter then proceeds to continue replaying LTPs to the receiver the until the buffer pointer has wrapped and returned to its starting slot or Nullcount n has reached zero, wherein a Nullcount countdown begins with m and is decremented by 1 for each retransmitted reliable LTP. In response to a YES result for decision block 2249, the logic exits this Nullcount countdown loop and proceeds to block 2250.

The use of the Nullcount countdown results in a safety margin of approximately m LTP transfer cycles for configurations under which the buffer depth is greater than but within m LTP transfer cycles of the roundtrip duration. For example, suppose that the buffer depth is 32 slots and the roundtrip duration is equal to 30 LTP transfer cycles, and m=5. In this case, m would be 3 when the logic exited the countdown loop. This means that every time replay the buffer wraps back to its start (slot 0), 3 extra Null LTPs would be transmitted prior to overwriting the LTP in slot 0. Since the buffer depth is 32 slots, the number of LTP cycles between replay buffer slots being overwritten is 35, or 5 more than the roundtrip duration.

In response to detection of a bad lane, a link may be operated in a degraded state with a reduced number of active lanes. Moreover, this link degraded state may cascade, such that a link may be operated in an sequences such as starting with four active lanes, detecting a first bad lane and removing the bad lane, leading to a link operation with three active lanes, detecting a second bad lane and removing the second bad lane, leading to a link operation with two active lanes. This cascade could continue with detection of a third bad lane, leading to link operation over the single remaining good lane. It is also noted that a link may be operated in an asymmetrical configuration, such that one transmit direction may use a different number of active lanes than the other transmit direction.

Figure 26:
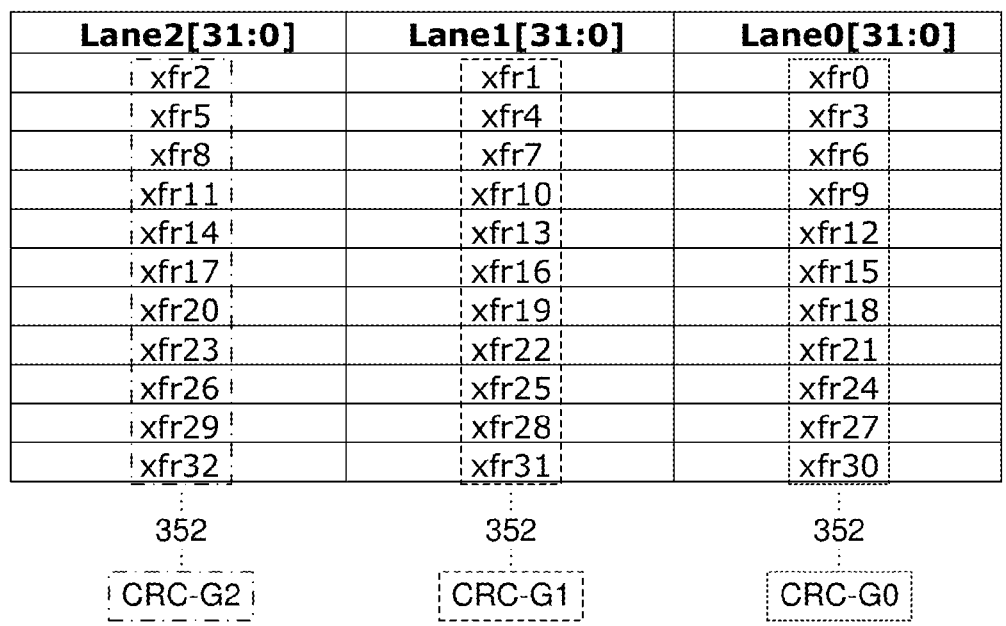
FIG. 26 is a diagram illustrating transfer of a standard detection LTP over three lanes under which 11 XFRs are transferred per lane in parallel, according to one embodiment.

FIG. 26 depicts the XFR groups for operating a link with three active lanes, according to one embodiment. In this instance, there are three XFR groups G0, G1, and G2, and the corresponding CRCs are CRC-G0, CRC-G1, and CRC-G2. Since the LTP sequence only has a single state with the XFR pattern being repeated without lane changes, the same XFR groups are transmitted over the same respective lanes. As a result, the per-lane CRC comparisons can be made on a per-lane basis, or otherwise the per XFR-group basis does not consider an LTP sequence state. Under 3 lanes, there are 11 32-bit transfers for each lane, resulting in 352 bits transmitted over each lane per standard detection LTP. In one embodiment, a 16-bit per-lane CRC is used when operating under three active lanes.

FIG. 27 depicts the XFR groups for operating a link with two active lanes, according to one embodiment. Since there are 33 32-bit transfers per LTP, the number of bits transferred over each of lanes 0 and 1 for an LTP transmit stream will alternate between 512 and 544 bits. As a result, a per XFR-group per-lane CRC comparison scheme is implemented using two LTP sequence states. In addition, a 16-bit per-lane CRC is used in one embodiment.

FIG. 28 depicts the XFR groups for operating a link with a single active lane, according to one embodiment. Since there is only a single lane over which LTP data is sent, it is the only lane that could be errant. As a result, there is no need to perform a per-lane CRC comparison. However, under a lane degradation scenarios under which a link with more than a single lane is degraded to operating under a single lane, a per-lane CRC calculation may still be calculated for the single lane, since this may be implemented in hardware in a manner under which it is always performed. In this instance, the per-lane CRC calculations are simply ignored.

As discussed above, under embodiments disclosed herein, links support reliable data transmission without use of explicit ACKs. Although an LTP cannot be lost when being transmitted across a link (absent an event such as a cable being cut), it can contain errors. Recall that the implicit acknowledgement scheme is implemented via the lack of receiving a retry request at the transmitter within a time period that is at least as long as the time it takes to complete a roundtrip from a transmitter to a receiver and back to the transmitter. Since the retry request is sent over a different set of lanes than the transmitted data, it is possible that a single retry request could have an error (identified by the CRC check), and thus be tossed. As a result, a receive side link interface could be trying to inform the transmit-side link interface that it received an errant LTP, but the notification (indicated by the retry request) would be tossed. This is where the sending of a sequential pair of RetryReqLTPs and pairs of other null LTPs (e.g., RetryMrkr0, RetryMrkr1) helps facilitate the implicit ACK scheme.

First, since these are null LTPs, they are not stored in a replay buffer, and thus not available for retransmission. However, by sending a sequential pair of null LTPs it is guaranteed that one of two events will result: 1) successful receipt of at least one or the two null LTPs without errors; or 2) if both LTPs have errors, this will be detected as sequential LTP errors, triggering retraining of the link. During (re)training, the training sequence is performed by both transmitter-receiver pairs of the link partners, thus proper operations for the link in both directions is verified before returning the link to active operation. When the retraining is complete, the transmit-sides waits (sending null LTPs in the meantime) for the guaranteed retry request from the receive-side before starting to send new (or continuing replay of) LTPs after sending the retry marker(s). Another benefit is sending a pair of these null packets is that increases the likelihood that at least one of the LTPs will be good.

Figure 29:
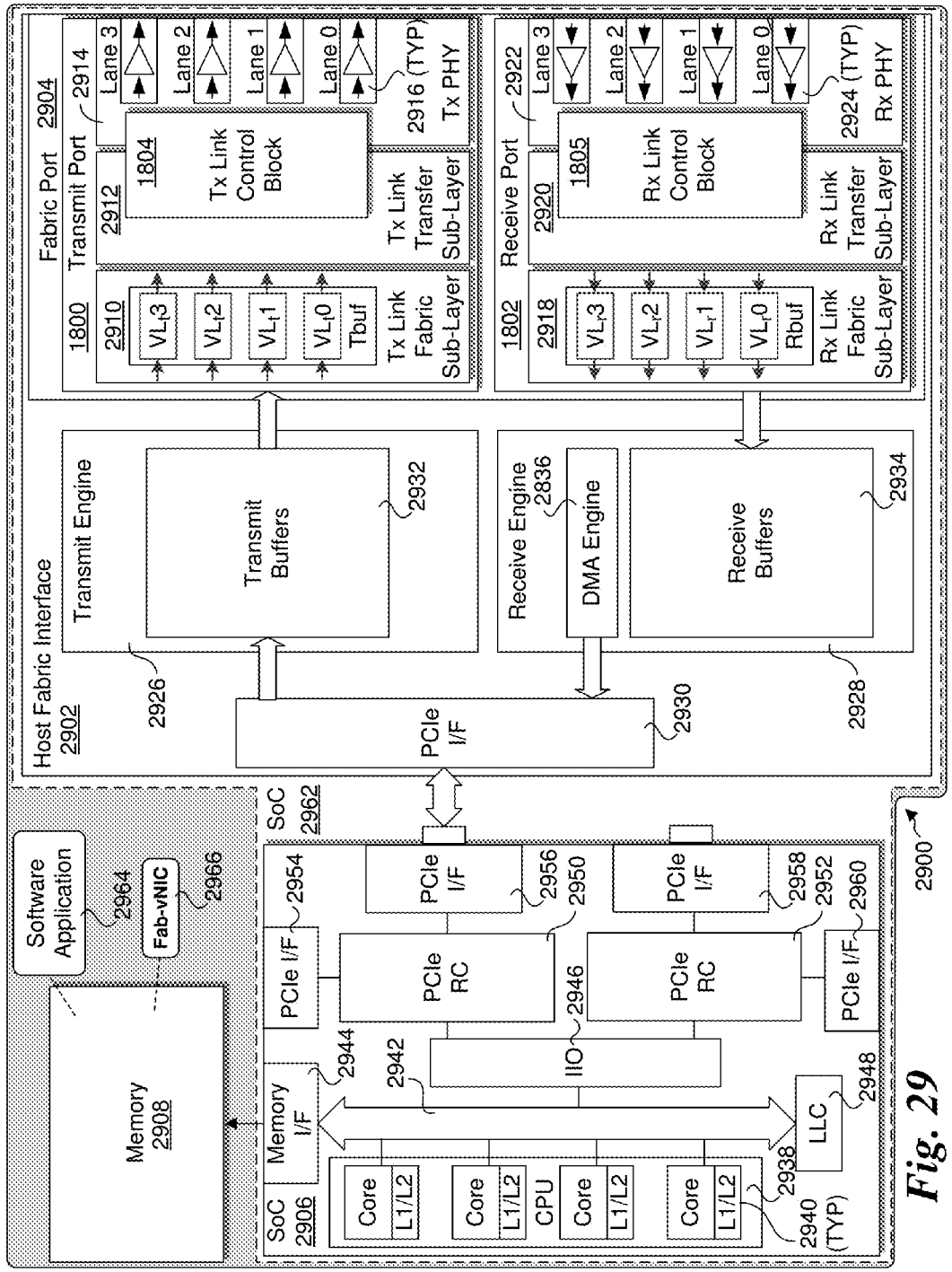
FIG. 29 is a schematic diagram of a system including an HFI, according to one embodiment.

FIG. 29 shows a node 2900 having an exemplary configuration comprising a host fabric interface 2902 including a fabric port 2904 coupled to a processor 2906, which in turn is coupled to memory 2908. As shown in FIG. 1, system nodes may have various configurations, such as but not limited to those shown by discrete single node platform 106, virtualized platform 110, multi-node platform 116 and integrated single node platform 120. Generally, each node configuration will include at least one processor, memory, and at least one HFI having similar components illustrated in FIG. 29.

Fabric port 2904 includes a transmit port 1800 and a receive port 1802 having a configuration similar to that shown in FIG. 18a-18c, in addition to other circuitry and logic both shown and not shown in FIG. 29, as discussed below. Transmit port 1800 includes Tx Link Fabric Sub-layer circuitry and logic 2910 including a transmit buffer (Tbuf) partitioned into a plurality of transmit VL buffers, Tx Link Transfer Sub-layer circuitry and logic 2912, and Tx PHY circuitry and logic 2914 including four transmitters 2916, and a Tx Link Control Block 1804. Receive port 1802 includes Rx Link Fabric Sub-layer circuitry and logic 2918 including a receive buffer (Rbuf) partitioned into plurality of receive VL buffers, Rx Link Transfer Sub-layer circuitry and logic 2920, and Rx PHY circuitry and logic 2922 including four receivers 2924, and an Rx Link Control Block 1805.

Tx Link Fabric Sub-Layer circuitry and logic 2910 is configured to implement the transmit-side aspects of the Link Fabric Sub-Layer operations described herein. In addition to the transmit buffer and transmit VL buffers illustrated in FIG. 29, components and blocks for facilitating these operations that are not illustrated include a Fabric Packet build block that includes an L4 encapsulation sub-block that is configured to perform L4 encapsulation of Ethernet, InfiniBand, and native architecture packets, arbitration logic, and a credit manager. Additionally a portion of the logic for facilitating QoS operations is implemented at the Link Fabric Sub-Layer (also not shown).

Tx Link Transfer Sub-Layer circuitry and logic 2912 is configured to implement the transmit-side aspects of the Link Transfer Sub-Layer operations described herein. These include various components and logic blocks for bundling LTPs, preparing an LTP stream for handoff to the Tx PHY, and supporting replay of LTPs in response to RetryReqs, including retry logic, an LTP bundling block, a replay buffer, and NxtWrLTP and NxtTxLTP pointers (all not shown). In addition, a portion of Tx Link Control Block 1804 and the QoS functions are implemented for the Tx Link Transfer Sub-Layer.

Tx PHY circuitry and logic 2914 is illustrated in a simplified form that includes four transmitters 2916 and a portion of Tx Link Control Block 1804. Generally, transmitters 2916 may comprise electrical or optical transmitters, depending on the PHY layer configuration of the link. It will be understood by those having skill in the networking arts that a Tx PHY circuitry and logic block will including additional circuitry and logic for implementing transmit-side PHY layer operations that are not shown for clarity. This including various sub-layers within a PHY layer that are used to facilitate various features implemented in connection with high-speed interconnect to reduce errors and enhance transmission characteristics.

Rx Link Fabric Sub-Layer circuitry and logic 2918 is configured to implement the receive-side aspects of the Link Fabric Sub-Layer operations described herein. In addition to the illustrated receive buffer and receive VL buffers, non-illustrated components and blocks for facilitating these operations include a Fabric Packet reassembly block including an L4 packet de-capsulation sub-block, a credit return block, and a portion of QoS receive-side logic.

Rx Link Transfer Sub-Layer circuitry and logic 2920 is configured to implement the receive-side aspects of the Link Transfer Sub-Layer operations described herein. These include various components and logic blocks for unbundling LTPs, detecting LTP CRC and per-lane CRC errors, receiver tossing mode and associated operations, and QoS operations, such as those shown in FIGS. 18a-18c and discussed above.

Rx PHY circuitry and logic 2922 is illustrated in a simplified form that includes four receivers 2924 and a portion of Rx Link Control Block 1805. Generally, receivers 2924 may comprise electrical or optical transmitters, depending on the PHY layer configuration of the link, and will be configured to receive signals transmitter over the link from transmitters 2916. It will be understood by those having skill in the networking arts that an Rx PHY circuitry and logic block will including additional circuitry and logic for implementing receive-side PHY layer operations that are not shown for clarity. This including various sub-layers within a PHY layer that are used to facilitate various features implemented in connection with high-speed interconnect to reduce errors and enhance transmission characteristics.

HFI 2902 further includes a transmit engine 2926 and a receive engine 2928 coupled to a PCIe (Peripheral Component Interconnect Express) interface (I/F) 2930. Transmit engine 2926 includes transmit buffers 2932 in which L4 packets (e.g., Ethernet packets including encapsulated TCP/IP packets, InfiniBand packets) and/or Fabric Packets are buffered. In one embodiment, all or a portion of the memory for transmit buffers 2932 comprises memory-mapped input/output (MMIO) address space, also referred to a programmed IO (PIO) space. MMIO enables processor 2906 to perform direct writes to transmit buffers 2932, e.g., via direct memory access (DMA writes).

Receive engine 2928 includes receive buffers 2934 and a DMA engine 2936. Receive buffers are used to buffer the output of receive port 1802, which may include Fabric Packets and/or L4 packets. DMA engine 2936 is configured to perform DMA writes to copy the packet data from receive buffers 2934 to memory 2908 and/or one of the memory cache levels in processor 2906. For example, in some embodiments packet header data is DMA'ed to cache, while packet payload data is DMA'ed to memory.

Processor 2906 includes a CPU 2938 including a plurality of processor cores 2940, each including integrated Level 1 and Level 2 (L1/L2) caches and coupled to an coherent interconnect 2942. Also coupled to coherent interconnect 2942 is a memory interface 2944 coupled to memory 2908, an integrated input/output block (IIO) 2946, and a Last Level Cache (LLC) 2948. IIO 2946 provides an interface between the coherent domain employed by the processor cores, memory, and caches, and the non-coherent domain employed for IO components and IO interfaces, including a pair of PCIe Root Complexes (RCs) 2950 and 2952. As is well-known in the art, a PCIe RC sits at the top of a PCIe interconnect hierarchy to which multiple PCIe interfaces and PCIe devices may be coupled, as illustrated by PCIe interfaces 2954, 2956, 2958, and 2960. As shown, PCIe 2956 is coupled to PCIe interface 2930 of HFI 2902.

In some embodiments, such as illustrated in FIG. 29, processor 2912 employs an SoC architecture. In other embodiments, PCIe-related components are integrated in an IO chipset or the like that is coupled to a processor. In yet other embodiments, processor 2912 and one or more HFIs 2902 are integrated on an SoC, such as depicted by the dashed outline of SoC 2962.

As further illustrated in FIG. 29, software applications 2964 and Fabric vNIC 2966 comprise software components running on one or more of processor cores 2940 or one or more virtual machines hosted by an operating system running on processor 2906. In addition to these software components, there are additional software components and buffers implemented in memory 2908 to facilitate data transfers between memory 2908 (including applicable cache levels) and transmit engine 2926 and receive engine 2934.

In general, the circuitry, logic and components depicted in the figures herein may also be implemented in various types of integrated circuits (e.g., semiconductor chips) and modules, including discrete chips, SoCs, multi-chip modules, and networking/link interface chips including support for multiple network interfaces. Also, as used herein, circuitry and logic to effect various operations may be implemented via one or more of embedded logic, embedded processors, controllers, microengines, or otherwise using any combination of hardware, software, and/or firmware. For example, the operations depicted by various logic blocks and/or circuitry may be effected using programmed logic gates and the like, including but not limited to ASICs, FPGAs, IP block libraries, or through one or more of software or firmware instructions executed on one or more processing elements including processors, processor cores, controllers, microcontrollers, microengines, etc.

In addition, aspects of embodiments of the present description may be implemented not only within a semiconductor chips, SoCs, multichip modules, etc., but also within non-transient machine-readable media. For example, the designs described above may be stored upon and/or embedded within non-transient machine readable media associated with a design tool used for designing semiconductor devices. Examples include a netlist formatted in the VHSIC Hardware Description Language (VHDL) language, Verilog language or SPICE language, or other Hardware Description Language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

Italicized letters, such as 'n', 'm', 'k', etc. in the foregoing detailed description and the claims are used to depict an integer number, and the use of a particular letter is not limited to particular embodiments. Moreover, the same letter may be used in separate claims to represent separate integer numbers, or different letters may be used. In addition, use of a particular letter in the detailed description may or may not match the letter used in a claim that pertains to the same subject matter in the detailed description.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. An apparatus, comprising:
  a link interface including,
  a receive port comprising a plurality of receive lanes, each configured to receive a respective bitstream of a plurality of bitstreams transmitted in parallel from a transmit port of a link interface peer; and
  circuitry and logic to,
    process the plurality of bitstreams as they are received and extract data comprising link packets transmitted from the link interface peer;
    detect a bad received link packet; and
    detect an errant receive lane that caused the bad received link packet.

2. The apparatus of claim 1, wherein detection of a bad received link packet is facilitated through use of a transmitted data integrity check value transmitted with each link packet, and wherein each of the bitstreams transmitted over each lane do not include an individual transmitted data integrity check value for that bitstream.

3. The apparatus of claim 1, wherein the circuitry and logic to detect an errant receive lane includes circuitry and logic to:
  calculate, for each receive lane, a data integrity check value over data received on that lane corresponding to a first transmission of a link packet, the first transmission of the link packet resulting in a bad received link packet;
  calculate, for each receive lane, a data integrity check value over data received on that lane corresponding to a retransmission of the link packet; and
  compare the data integrity check values for the first transmission and retransmission of the link packet on a per-lane basis to determine which receive lane is errant.

4. The apparatus of claim 1, wherein link packets are transmitted using a sequence under which at least one receive lane receives a different amount of data than at least one other receive lane in connection with receipt of data for a given link packet, and wherein a lane or lanes receiving the different amount of data changes depending on the state of the sequence when the link packet is transmitted.

5. The apparatus of claim 4, wherein during receipt of data for a link packet, the bitstream data received on a given lane comprises a transfer group that is dependent on the state of the sequence when the link packet is transmitted, wherein the circuitry and logic to detect an errant receive lane includes circuitry and logic to:
  calculate, for each receive lane, a data integrity check value over data comprising a first transfer group received on that lane corresponding to a first transmission of a link packet, the first transmission of the link packet being transmitted under a first sequence state and resulting in a bad received link packet;
  calculate, for each receive lane, a data integrity check value over data comprising a second transfer group received on that lane corresponding to a retransmission of the link packet that is transmitted under a second sequence state; and
  compare the data integrity check values for the first transmission and retransmission of the link packet on a per-transfer group basis to determine which receive lane is errant.

6. The apparatus of claim 1, further comprising circuitry and logic to:
  receive indicia from the link interface peer indicating a link packet corresponding to the bad link packet is being or is to be retransmitted; and
  employ the indicia to detect reception of the retransmitted link packet.

7. The apparatus of claim 1, further comprising circuitry and logic to:
  detect receipt of a sequence of bad link packets; and
  determine a receive lane causing at least one of the bad link packets in the sequence to be errant.

8. The apparatus of claim 7, further comprising circuitry and logic to,
  detect occurrences of receiving sequences of bad link packets; and
  detect a frequency of a lane causing errors leading to the occurrences.

9. The apparatus of claim 1, further comprising a transmit port comprising a plurality of transmit lanes and configured to transmit data comprising link packets via a plurality of bitstreams that are transmitted in parallel via the plurality of transmit lanes to a receive port of the link interface peer, and wherein the transmit port includes circuitry and logic to send a retransmission request via the transmit port to the link interface peer in response to detection of a bad link packet, the retransmission request including indicia that is configured to be processed by the link interface peer to identify the bad link packet.

10. The apparatus of claim 1, wherein the link interface further includes a transmit port and the link interface peer includes a receive port and the link interface and link interface peer are configured to support bi-directional communication over a link comprising a pair of unidirectional links from a transmit port to a receive port comprising n lanes, further comprising circuitry and logic to:
  identify an errant receive lane;
  perform link interface-side operations to re-initialize operation of the link under a degraded link configuration employing n-1 receive lanes not including the errant lane.

11. The apparatus of claim 10, wherein the errant lane comprises a first errant lane, the apparatus further comprising circuitry and logic to:
  receive link packet data via the n-1 receive lanes corresponding to link packets transmitted from the transmit port of the link interface peer;
  identify a second errant receive lane from among the n-1 receive lanes;
  perform link interface-side operations to re-initialize operation of the link under a degraded link configuration employing n-2 receive lanes not including the first and errant second errant lanes.

12. An apparatus, comprising:
a link interface including,
a receive port comprising a plurality of receive lanes, each configured to receive a respective bitstream of a plurality of bitstreams transmitted in parallel from a transmit port of a link interface peer; and
circuitry and logic to,
  process the plurality of bitstreams and extract data comprising link packets transmitted from the link interface peer;
  calculate a per-lane data integrity check value over data that is received on each receive lane for the link packet;
  detect received data for a link packet is bad; and in response thereto,
    store per-lane data integrity check values for the bad link packet;
    receive a retransmitted link packet corresponding to the bad link packet;
    recalculate a per-lane data integrity check value over data that is received on each receive lane for the retransmitted link packet; and
    compare stored per-lane data integrity check values with the recalculated per-lane data integrity check values to detect an errant receive lane.

13. The apparatus of claim 12, wherein each link packet includes a transmitted cyclic redundancy check (CRC) value calculated at the link interface peer, further comprising circuitry and logic to calculate a received CRC value based on received data for the link packet and compare the received CRC value with the transmitted CRC value to determine if the link packet is bad.

14. The apparatus of claim 12, wherein link packets are transmitted using a sequence under which at least one receive lane receives a different amount of data than at least one other receive lane in connection with receipt of data for a given link packet, and wherein a lane or lanes receiving the different amount of data changes depending on the state of the sequence when the link packet is transmitted.

15. The apparatus of claim 14, wherein during receipt of data for a link packet, the bitstream data received on a given lane comprises a transfer-group that is dependent on the state of the sequence when the link packet is transmitted, and wherein the states of the sequence when the link packet is transmitted and when the link packet is retransmitted are different, the apparatus further comprising circuitry and logic to:
 store the per-lane integrity check values on a per transfer-group basis; and
 compare per transfer-group integrity check values for the transmitted packet and the retransmitted packet to identify an errant lane.

16. The apparatus of claim 12, further comprising circuitry and logic to:
 in response to detection of a bad link packet;
 change a receive mode from a normal mode to a discard mode under which received link packets are discarded;
 receive indicia indicating a link packet corresponding to the bad link packet is to be retransmitted; and
 return the receive mode to the normal mode in preparation for receiving the retransmitted link packet.

17. The apparatus of claim 12, further comprising circuitry and logic to:
 in response to detection of a bad link packet;
 change a receive mode from a normal mode to a discard mode under which received link packets are discarded;
 detect n sequential bad link packets are received; and
 initiate one of a link retraining or link initialization process.

18. The apparatus of claim 17, further comprising circuitry and logic to determine a receive lane causing at least one of the n sequential bad link packets to be bad.

19. The apparatus of claim 12, wherein the link interface further includes a transmit port and the link interface peer includes a receive port and the link interface and link interface peer are configured to support bi-directional communication over a link comprising a pair of unidirectional links from a transmit port to a receive port comprising n lanes, further comprising circuitry and logic to:
 identify an errant receive lane;
 perform link interface-side operations to re-initialize operation of the link under a degraded link configuration employing n-1 receive lanes not including the errant lane.

20. The apparatus of claim 19, wherein the errant lane comprises a first errant lane, the apparatus further comprising circuitry and logic to:
 receive link packet data via the n-1 receive lanes corresponding to link packets transmitted from the link interface peer;
 calculate a per-lane data integrity check value over data that is received on each of the n -1 receive lanes for the link packet;
 detect received data for a link packet is bad; and in response thereto,
  store per-lane data integrity check values for the bad link packet for each of the n-1 receive lanes;
  receive a retransmitted link packet associated with the link packet;
  recalculate a per-lane data integrity check value over data that is received on each of the n-1 receive lanes for the retransmitted link packet;
  compare stored per-lane data integrity check values with the recalculated per-lane data integrity check values to detect a second errant receive lane from among the n-1 receive lanes; and
 perform link interface-side operations to re-initialize operation of the link under a degraded link configuration employing n-2 receive lanes not including the first and errant second errant lanes.

21. A method, comprising:
 receiving, at a receive port of a link interface via a plurality of receive lanes, a respective bitstream of a plurality of bitstreams transmitted in parallel from a transmit port of a link interface peer;
 processing the plurality of bitstreams as they are received and extracting data comprising link packets transmitted from the link interface peer;
 detecting a bad received link packet; and
 detecting an errant receive lane that caused the bad received link packet,
 wherein detection of a bad received link packet is facilitated through use of a transmitted data integrity check value transmitted with each link packet, and wherein each of the bitstreams transmitted over each lane do not include an individual transmitted data integrity check value for that bitstream.

22. The method of claim 21, wherein detection of the errant receive lane comprises,
 processing the plurality of bitstreams and extracting data comprising link packets transmitted from the link interface peer;
 calculating a per-lane or per transfer group data integrity check value over data that is received on each receive lane for the link packet;
 detecting received data for a link packet is bad; and in response thereto,
  storing per-lane or per transfer group data integrity check values for the bad link packet;
  receiving a retransmitted link packet corresponding to the bad link packet;
  recalculating a per-lane or per transfer group data integrity check value over data that is received on each receive lane for the retransmitted link packet; and
  comparing stored per-lane or per transfer group data integrity check values with the recalculated per-lane data integrity check values to detect an errant receive lane.

23. The method of claim 21, wherein detection of the errant lane comprises:
 calculating, for each receive lane, a data integrity check value over data received on that lane corresponding to a first transmission of a link packet, the first transmission of the link packet resulting in a bad received link packet;
 calculating, for each receive lane, a data integrity check value over data received on that lane corresponding to a retransmission of the link packet; and
 comparing the data integrity check values for the first transmission and retransmission of the link packet on a per-lane basis to determine which receive lane is errant.

24. The method of claim 21, wherein link packets are transmitted using a sequence under which at least one receive lane receives a different amount of data than at least one other receive lane in connection with receipt of data for a given link packet, and wherein a lane or lanes receiving the different amount of data changes depending on the state of the sequence when the link packet is transmitted.

25. The method of claim 24, wherein during receipt of data for a link packet, the bitstream data received on a given lane comprises a transfer group that is dependent on the state of the sequence when the link packet is transmitted, wherein the detecting an errant receive lane comprises:
- calculating, for each receive lane, a data integrity check value over data comprising a first transfer group received on that lane corresponding to a first transmission of a link packet, the first transmission of the link packet being transmitted under a first sequence state and resulting in a bad received link packet;
- calculating, for each receive lane, a data integrity check value over data comprising a second transfer group received on that lane corresponding to a retransmission of the link packet that is transmitted under a second sequence state; and
- comparing the data integrity check values for the first transmission and retransmission of the link packet on a per-transfer group basis to determine which receive lane is errant.

26. The method of claim 21, further comprising:
- receiving a retry marker from the link interface peer indicating a retransmitted link packet corresponding to the bad link packet will follow the retry marker by n link packets; and
- counting down from n following receipt of the retry marker to detect reception of the retransmitted link packet.

27. The method of claim 21, further comprising:
- detecting receipt of sequential bad link packets; and
- determining a receive lane causing at least one of the sequential bad link packets to be errant.

28. The method of claim 27, further comprising:
- detecting occurrences of sequential bad link packets;
- detecting a frequency of a lane causing errors leading to the occurrences; and
- if the frequency of a lane causing errors leading to occurrences of sequential bad link packets reaches a threshold, re-initializing the link with the lane causing the errors removed.

29. The method of claim 21, wherein the link interface further includes a transmit port and the link interface peer includes a receive port and the link interface and link interface peer are configured to support bi-directional communication over a link comprising a pair of unidirectional links from a transmit port to a receive port comprising n lanes, further comprising circuitry and logic to:
- identifying an errant receive lane;
- performing link interface-side operations to re-initialize operation of the link under a degraded link configuration employing n-1 receive lanes not including the errant lane.

30. The method of claim 29, wherein the errant lane comprises a first errant lane, the method further comprising:
- receiving link packet data via the n-1 receive lanes corresponding to link packets transmitted from the transmit port of the link interface peer;
- identifying a second errant receive lane from among the n-1 receive lanes;
- performing link interface-side operations to re-initialize operation of the link under a degraded link configuration employing n-2 receive lanes not including the first and second errant lanes.

* * * * *